(12) United States Patent
Xu et al.

(10) Patent No.: US 11,127,659 B2
(45) Date of Patent: Sep. 21, 2021

(54) PARALLEL ELECTRODE COMBINATION, POWER MODULE AND POWER MODULE GROUP

(71) Applicant: YANGZHOU GUOYANG ELECTRONIC CO.,LTD., Jiangsu (CN)

(72) Inventors: Wenhui Xu, Jiangsu (CN); Yulin Wang, Jiangsu (CN); Hesong Teng, Jiangsu (CN)

(73) Assignee: YANGZHOU GUOYANG ELECTRONIC CO., LTD., Jiangsu (CN)

( * ) Notice: Subject to any disclaimer, the term of this patent is extended or adjusted under 35 U.S.C. 154(b) by 19 days.

(21) Appl. No.: 16/631,839

(22) PCT Filed: Sep. 1, 2017

(86) PCT No.: PCT/CN2017/100105
§ 371 (c)(1),
(2) Date: Jan. 17, 2020

(87) PCT Pub. No.: WO2019/041292
PCT Pub. Date: Mar. 7, 2019

(65) Prior Publication Data
US 2020/0161224 A1 May 21, 2020

(30) Foreign Application Priority Data
Aug. 30, 2017 (CN) .......................... 201710764066.1

(51) Int. Cl.
*H01L 23/495* (2006.01)
*H01L 23/32* (2006.01)
(Continued)

(52) U.S. Cl.
CPC ........ *H01L 23/49517* (2013.01); *H01L 23/32* (2013.01); *H01L 23/3675* (2013.01);
(Continued)

(58) Field of Classification Search
CPC ................................................. H01L 23/49517
(Continued)

(56) References Cited

U.S. PATENT DOCUMENTS 5,365,108 A    11/1994  Anderson et al.
2005/0224945 A1 * 10/2005  Saito ................. H01L 23/49575
                                                                257/686
(Continued)

FOREIGN PATENT DOCUMENTS

CN    103545282    1/2014
CN    105895608    8/2016
JP    2003133515 A  *  5/2003

OTHER PUBLICATIONS

"International Search Report (Form PCT/ISA/210) of PCT/CN2017/100105," dated Jun. 5, 2018, with English translation thereof, pp. 1-4.

*Primary Examiner* — Ajay Arora
(74) *Attorney, Agent, or Firm* — JCIPRNET

(57) ABSTRACT

The invention discloses a parallel electrode combination, which includes a first power module electrode and a second power module electrode, wherein a soldering portion of the first power module electrode and a soldering portion of the second power module electrode are respectively used to connect a copper layer of a power source inside a power module, and a connecting portion of the first power module electrode and a connecting portion of the second power module electrode are opposite in parallel. The invention further discloses a power module and a power module group using the parallel electrode combination. In the invention, the connecting portion of the first power module electrode (Continued)

and the connecting portion of the second power module electrode are opposite in parallel.

11 Claims, 23 Drawing Sheets

(51) Int. Cl.
  H01L 23/367        (2006.01)
  H01L 23/00         (2006.01)
  H01L 25/16         (2006.01)
(52) U.S. Cl.
  CPC .. *H01L 23/49562* (2013.01); *H01L 23/49582* (2013.01); *H01L 23/49589* (2013.01); *H01L 24/48* (2013.01); *H01L 25/162* (2013.01); *H01L 24/49* (2013.01); *H01L 2224/4809* (2013.01); *H01L 2224/48137* (2013.01); *H01L 2224/48245* (2013.01); *H01L 2224/49176* (2013.01); *H01L 2924/1203* (2013.01); *H01L 2924/13055* (2013.01); *H01L 2924/19041* (2013.01); *H01L 2924/19107* (2013.01)
(58) Field of Classification Search
  USPC .......................................................... 257/676
  See application file for complete search history.

(56) References Cited

U.S. PATENT DOCUMENTS

2009/0280351 A1*  11/2009  Hirotsuru ............. C04B 41/009
                                                          428/613
2010/0148298 A1*  6/2010   Takano ................. H01L 25/072
                                                          257/500

* cited by examiner

PARALLEL ELECTRODE COMBINATION, POWER MODULE AND POWER MODULE GROUP

CROSS-REFERENCE TO RELATED APPLICATION

This is a 371 application of the International PCT application serial no. PCT/CN2017/100105, filed on Sep. 1, 2017, which claims the priority benefits of China Application No. 201710764066.1, filed on Aug. 30, 2017. The entirety of each of the above-mentioned patent applications is hereby incorporated by reference herein and made a part of this specification.

TECHNICAL FIELD

The present invention relates to a parallel electrode combination, a power module and a power module group.

BACKGROUND

The global energy crisis and the threat of climate warming make people pay more and more attention to energy saving, emission reduction and low carbon development while pursuing economic development. With the international establishment and promotion of green environmental protection, the development and application prospects of power semiconductors have been broadened.

The stray inductance of the existing power electronic power module and power module group is often relatively large, and the reason is that the stray inductance brought by electrodes accounts for a large part, which may result in large overshoot voltage and increased loss, and also limit the application in high switching frequency occasions.

SUMMARY

Object of the invention: the present invention is intended to provide a parallel electrode combination which may greatly reduce stray inductance, a power module and a power module group.

Technical solutions: a parallel electrode combination of the present invention includes a first power module electrode and a second power module electrode, wherein a soldering portion of the first power module electrode and a soldering portion of the second power module electrode are respectively used to connect a copper layer of a power source inside a power module, and a connecting portion of the first power module electrode and a connecting portion of the second power module electrode are opposite in parallel.

Further, the connecting portion of the first power module electrode and the connecting portion of the second power module electrode are both respectively provided with a connecting hole. In this way, fixation may be realized by penetrating a fixing device through the connecting hole.

Further, the connecting portion of the first power module electrode and the connecting portion of the second power module electrode have different lengths.

Further, a connecting hole for clamping a nut or a bolt head is arranged in the connecting hole of the connecting portion of the first power module electrode, or a connecting hole for clamping a nut or a bolt head is arranged in the connecting hole of the connecting portion of the second power module electrode. In this way, the nut or the bolt head may be embedded inside the connecting hole, and even if a surrounding insulating material is softened, the bolt cannot be loosened. However, if the nut or the bolt head is fastened above the connecting hole, the bolt is easily loosened once the surrounding insulating material is softened.

A power module using the parallel electrode combination of the present invention includes an upper half-bridge substrate and a lower half-bridge substrate, wherein the upper half-bridge substrate is provided with an upper half-bridge IGBT chip and an upper half-bridge diode chip, the lower half-bridge substrate is provided with a lower half-bridge IGBT chip and a lower half-bridge diode chip, the first power module electrode and the second power module electrode are respectively used as positive and negative electrodes, and in addition, the power module further includes an output electrode; a working current path after enabling the upper half-bridge IGBT chip is as follows: the working current flows from the connecting portion of the first power module electrode into the upper half-bridge substrate through a bonding wire, flows through the upper half-bridge IGBT chip, and then flows out to the output electrode through the bonding wire; a freewheel current path after disabling the upper half-bridge IGBT chip is as follows: the freewheel current flows from the connecting portion of the second power module electrode into the lower half-bridge substrate through a bonding wire, flows through the lower half-bridge diode chip, and then flows out to the output electrode through the bonding wire; the working current path after enabling the lower half-bridge IGBT chip is as follows: the working current flows from the connecting portion of the second power module electrode into the lower half-bridge substrate through a bonding wire, flows through the lower half-bridge IGBT chip, and then flows out to the output electrode through the bonding wire; and the freewheel current path after disabling the lower half-bridge IGBT chip is as follows: the freewheel current flows from the connecting portion of the first power module electrode into the upper half-bridge substrate through a bonding wire, flows through the upper half-bridge diode chip, and then flows out to the output electrode through the bonding wire. The power module of single-face heat dissipation may effectively reduce stray inductance.

A power module using the parallel electrode combination of the present invention includes a bottom substrate and a top substrate, wherein the bottom substrate is provided with an upper half-bridge chip and a middle substrate, the middle substrate is provided with a lower half-bridge chip, the first power module electrode and the second power module electrode are respectively used as positive and negative electrodes, and in addition, the power module further includes an output electrode; during working, a working current flows from the connecting portion of the first power module electrode into the bottom substrate, flows through the upper half bridge chip to the top substrate, and then flows out through a connecting portion of the output electrode; and during freewheeling, a freewheel current flows from the connecting portion of the second power module electrode to the lower half bridge chip through the top substrate, then flows into the middle substrate, then flows to the top substrate, and flows out through a connecting portion of the output electrode. The power module of double-face heat dissipation may effectively reduce stray inductance, and the middle substrate is arranged on the bottom substrate, which is more beneficial for reducing the stray inductance.

Further, an upper surface of the bottom substrate is provided with a positive electrode copper layer, a lower surface of the top substrate is provided with a negative electrode copper layer and an output electrode copper layer separated from each other, a first connecting block is arranged between the upper half-bridge chip and the output electrode copper layer, a second connecting block is arranged between the lower half-bridge chip and the negative electrode copper layer, and a connecting column is also arranged between the middle substrate and the output electrode copper layer; during working, a working current flows from the connecting portion of the first power module electrode into the upper half-bridge chip through the positive electrode copper layer, then flows to the output electrode copper layer through the first connecting block, and finally flows out from the connecting portion of the output electrode; and during freewheeling, a freewheel current flows from the connecting portion of the second power module electrode into the second connecting block through the negative electrode copper layer, then flows to the lower half-bridge chip, then flows to the middle substrate, then flows into the output electrode copper layer through the connecting column, and finally flows out from the connecting portion of the output electrode.

A power module group using the parallel electrode combination of the present invention includes a capacitor with a capacitor electrode combination and a power module with a power module electrode combination, wherein the capacitor electrode combination includes a first capacitor electrode and a second capacitor electrode opposite in parallel, the first capacitor electrode and the second capacitor electrode are respectively connected with positive and negative electrodes of a capacitor core group, the power module electrode combination is the parallel electrode combination, and the connecting portion of the first power module electrode and the connecting portion of the second power module electrode may be inserted into a gap between the first capacitor electrode and the second capacitor electrode.

Further, the first capacitor electrode is partially bulged, the second capacitor electrode is also partially bulge, a bulge of the first capacitor electrode and a bulge of the second capacitor electrode jointly form an accommodating cavity, and a connecting portion of the power module electrode combination may be inserted into the accommodating cavity.

Further, the first capacitor electrode and the second capacitor electrode are both located in a middle of a side surface of the capacitor. In this way, positive and negative current paths have the same length, and stray inductance may be further reduced.

Further, the first capacitor electrode and the second capacitor electrode are both plate-shaped. In this way, an opposite area between the first capacitor electrode and the second capacitor electrode is effectively increased and stray inductance is further reduced.

A power module group using the parallel electrode combination of the present invention includes a capacitor with a capacitor electrode combination and a power module with a power module electrode combination, wherein the capacitor electrode combination includes a first capacitor electrode and a second capacitor electrode, a soldering portion of the first capacitor electrode and a soldering portion of the second capacitor electrode are respectively connected with positive and negative electrodes of a capacitor core group, the soldering portion of the first capacitor electrode leads out a connecting portion of the first capacitor electrode, the soldering portion of the second capacitor electrode leads out a connecting portion of the second capacitor electrode, the connecting portion of the first capacitor electrode and the connecting portion of the second capacitor electrode are opposite in parallel, the connecting portion of the first capacitor electrode and the connecting portion of the second capacitor electrode are both respectively provided with a connecting hole, the power module electrode combination is the parallel electrode combination, and a connecting portion of the power module electrode combination is matched with a connecting portion of the capacitor electrode combination.

Further, the soldering portion of the first capacitor electrode and the soldering portion of the second capacitor electrode are opposite in parallel. In this way, stray inductance may be further reduced.

Further, the soldering portion of the first capacitor electrode and the soldering portion of the second capacitor electrode are both plate-shaped. In this way, an opposite area between the soldering portion of the first capacitor electrode and the soldering portion of the second capacitor electrode is effectively increased and stray inductance is further reduced.

Further, the soldering portion of the first capacitor electrode and the soldering portion of the second capacitor electrode are located in a middle of a side surface of the capacitor. In this way, positive and negative current paths have the same length, and stray inductance may be further reduced.

Beneficial effects: the present invention discloses the parallel electrode combination, the connecting portion of the first power module electrode and the connecting portion of the second power module electrode are opposite in parallel, which is not found in the prior art yet, and may greatly reduce stray inductance in comparison with the prior art, and is undoubtedly a great progress in the field. The present invention further discloses the power module and the power module group using the parallel electrode combination, which may greatly reduce stray inductance.

BRIEF DESCRIPTION OF THE DRAWINGS

FIG. 6A is a split schematic diagram of upper and lower half bridges.

FIG. 6B is a current path diagram of the upper half bridge.

FIG. 6C is a current path diagram of the lower half bridge.

FIG. 11A is a split schematic diagram of upper and lower half bridges.

FIG. 11B is a current path diagram of the upper half bridge.

FIG. 11C is a current path diagram of the lower half bridge.

FIG. 16A is a split schematic diagram of upper and lower half bridges.

FIG. 16B is a current path diagram of the upper half bridge.

FIG. 16C is a current path diagram of the lower half bridge.

FIG. 21A is a split schematic diagram of upper and lower half bridges.

FIG. 21B is a current path diagram of the upper half bridge.

FIG. 21C is a current path diagram of the lower half bridge; and

DETAILED DESCRIPTION

Figure 1:
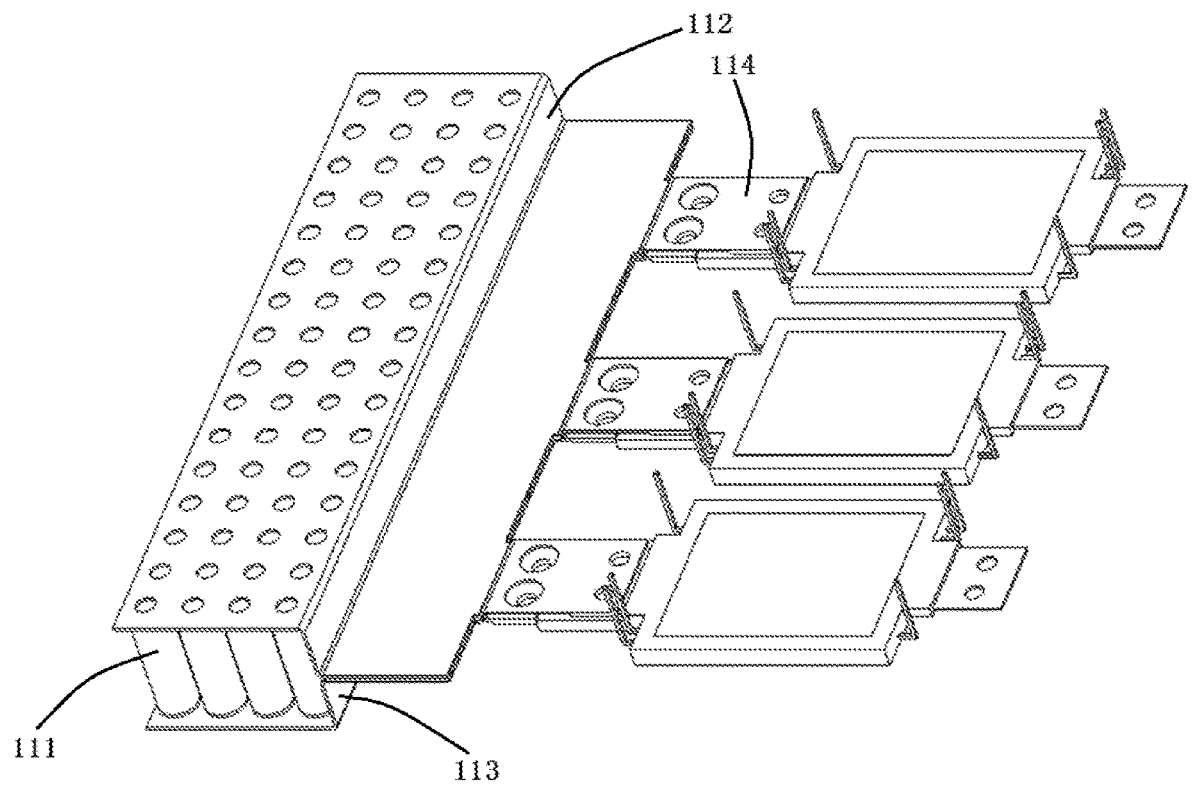
FIG. 1 is a structure diagram of a power module group according to Embodiment 1 of the present invention.

The technical solutions of the present invention are further described hereinafter with reference to the embodiments and the drawings.

Embodiment 1

Embodiment 1 discloses a power module group with a parallelly installed electrode combination, as shown in FIG. 1 to FIG. 5, which includes a capacitor with a capacitor electrode combination and a power module with a power module electrode combination. The capacitor electrode combination includes a first capacitor electrode and a second capacitor electrode, a soldering portion 112 of the first capacitor electrode is connected with a negative electrode of a capacitor core group 111, a soldering portion 113 of a second capacitor electrode is connected with a positive electrode of the capacitor core group 111, the soldering portion 112 of the first capacitor electrode and the soldering portion 113 of the second capacitor electrode are both plate-shaped and located in a middle of a side surface of the capacitor. The soldering portion 112 of the first capacitor electrode leads out a connecting portion 114 of the first capacitor electrode, the soldering portion 113 of the second capacitor electrode leads out a connecting portion 115 of the second capacitor electrode, the connecting portion 114 of the first capacitor electrode and the connecting portion 115 of the second capacitor electrode are opposite in parallel, and the connecting portion 114 of the first capacitor electrode is longer than the connecting portion 115 of the second capacitor electrode. The connecting portion 114 of the first capacitor electrode is provided with two first connecting holes 1141 and two second connecting holes 1142, the two first connecting holes 1141 are arranged side by side at one end of the connecting portion 114 of the first capacitor electrode connected with the soldering portion 112 of the first capacitor electrode, the two second connecting holes 1142 are arranged side by side at the other end of the connecting portion 114 of the first capacitor electrode, and the connecting portion 115 of the second capacitor electrode is provided with two third connecting holes 1151. The power module electrode combination includes a first power module electrode and a second power module electrode, a soldering portion 118 of the first power module electrode and a soldering portion of the second power module electrode are respectively connected with a copper layer of a power source inside the power module, the soldering portion 118 of the first power module electrode leads out a connecting portion 116 of the first power module electrode, the soldering portion of the second power module electrode leads out a connecting portion 117 of the second power module electrode, the connecting portion 116 of the first power module electrode and the connecting portion 117 of the second power module electrode are opposite in parallel, and the connecting portion 116 of the first power module electrode is longer than the connecting portion 117 of the second power module electrode. The connecting portion 116 of the first power module electrode is provided with two fourth connecting holes 1161 and two fifth connecting holes 1162, the two fourth connecting holes 1161 are arranged side by side at one end of the connecting portion 116 of the first power module electrode connected with the soldering portion 118 of the first power module electrode, the two fifth connecting holes 1162 are arranged side by side at the other end of the connecting portion 116 of the first power module electrode, and the connecting portion 117 of the second power module electrode is provided with two sixth connecting holes 1171. The first connecting hole 1141 and the fourth connecting hole 1161 are larger than other connecting holes.

Figure 2:
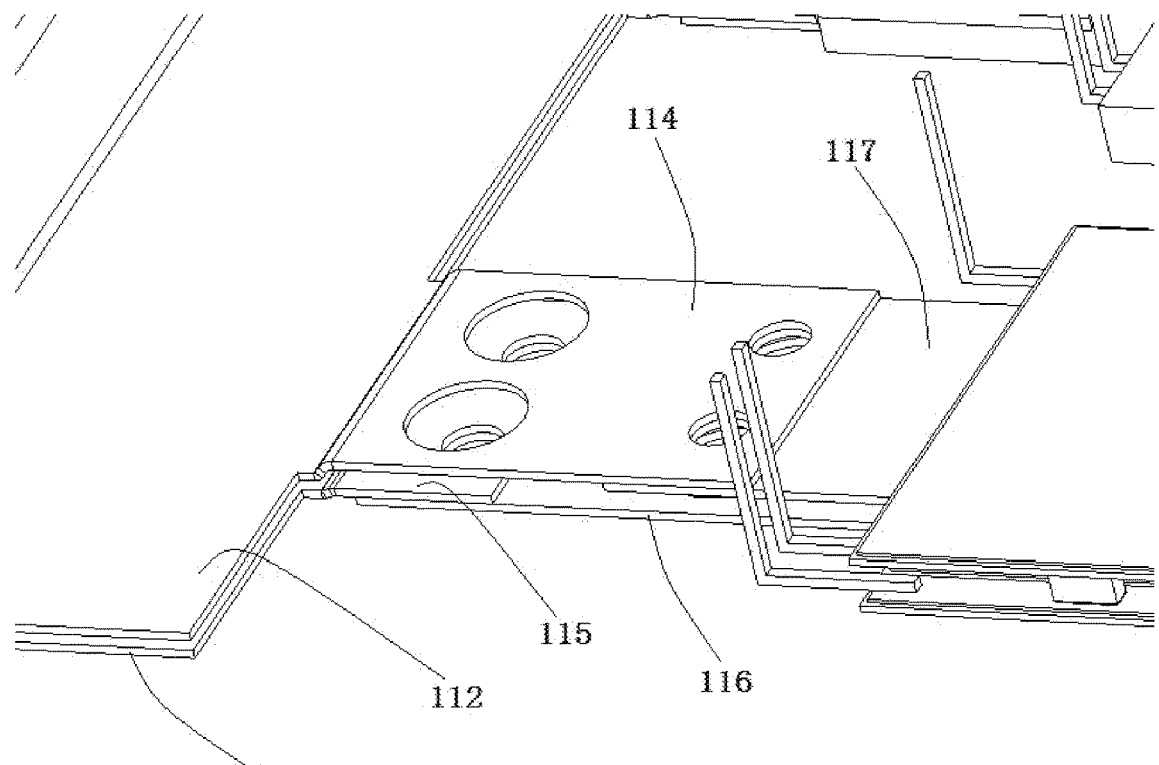
FIG. 2 is a partial enlarged diagram of the power module group according to Embodiment 1 of the present invention.
Figure 3:
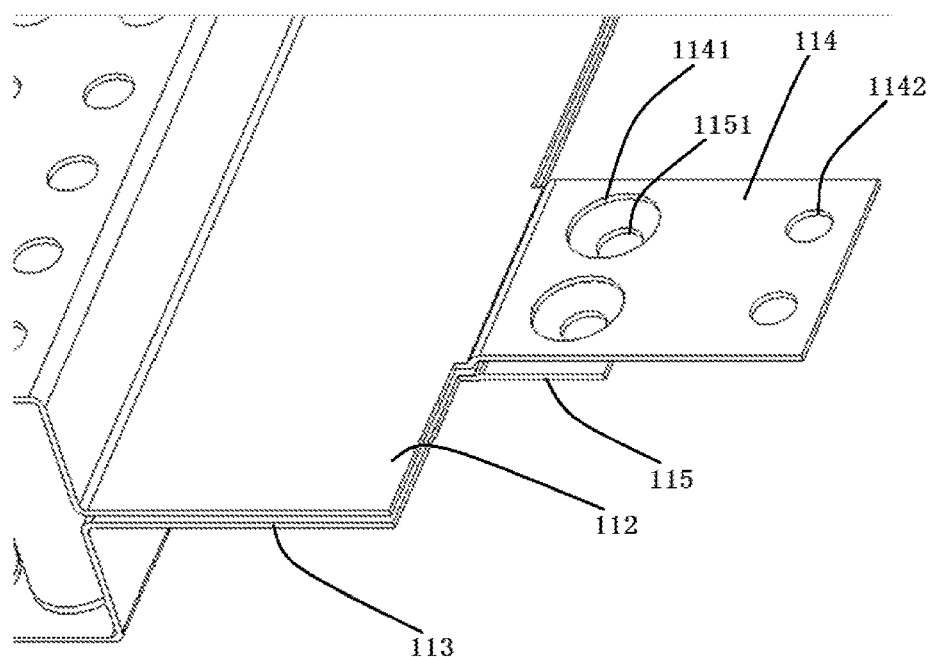
FIG. 3 is a structure diagram of a connecting portion of a capacitor electrode according to Embodiment 1 of the present invention.
Figure 4:
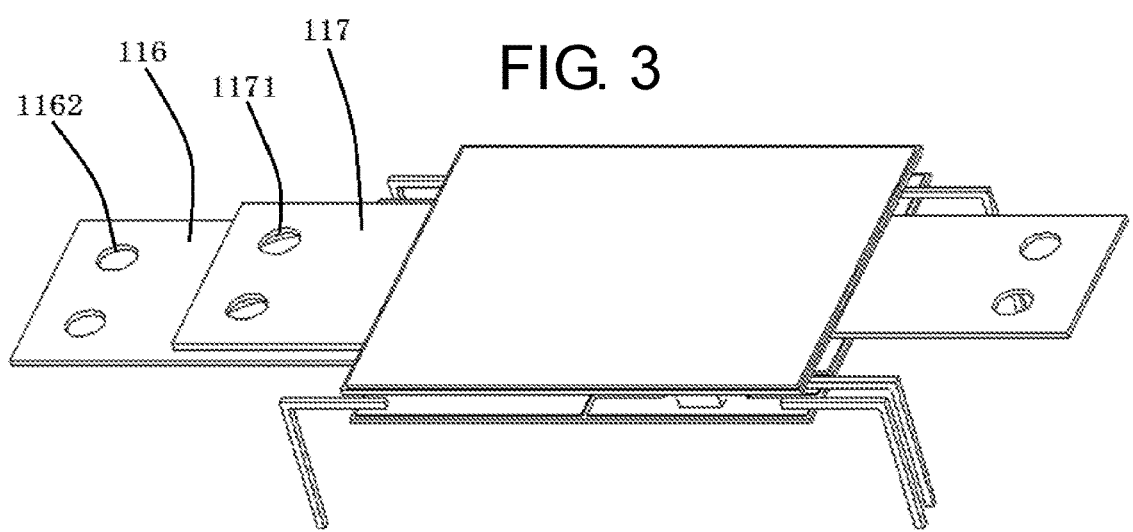
FIG. 4 is a structure diagram of a power module according to Embodiment 1 of the present invention.
Figure 5:
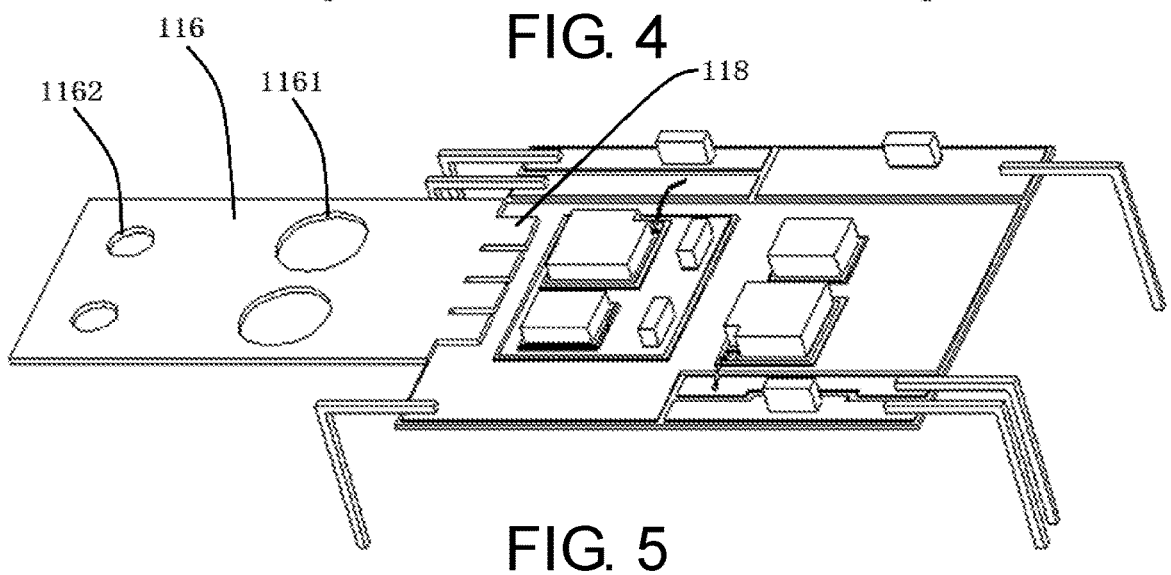
FIG. 5 is a structure diagram of a connecting portion of a first power module electrode according to Embodiment 1 of the present invention.

During use, the capacitor and the power module are usually fixed by a bolt and a nut, and a three-layer structure is formed during fixing, as shown in FIG. 2, the connecting portion 114 of the first capacitor electrode and the connecting portion 116 of the first power module electrode are located at two ends, and the connecting portion 115 of the second capacitor electrode and the connecting portion 117 of the second power module electrode are both located in a middle. Multiple modes are available in fixing, two of which are that: 1) the nut is embedded into the first connecting hole 1141, and a body of the bolt matched with the nut penetrates through the fifth connecting hole 1162 and the third connecting hole 1151, so as to be fixed tightly with the nut; and 2) the nut is embedded into the fourth connecting hole 1161, and the body of the bolt matched with the nut penetrates through the second connecting hole 1142 and the sixth connecting hole 1171, so as to be fixed tightly with the nut. 2) The bolt head is embedded into the first connecting hole 1141, the body of the bolt penetrates through the fifth connecting hole 1162 and the third connecting hole 1151, and the nut is fixed tightly with the bolt at the fifth connecting hole 1162; and the bolt head is embedded into the fourth connecting hole 1161, the body of the bolt penetrates through the second connecting hole 1142 and the sixth connecting hole 1171, and the nut is fixed tightly with the bolt at the second connecting hole 1142.

The power module may be internally provided with a single-face heat-dissipation structure or a double-face heat-dissipation structure. The solutions adopting the single-face heat-dissipation structure and the double-face heat-dissipation structure are described hereinafter respectively.

1. Adoption of Single-Face Heat-Dissipation Structure

Figure 6A:
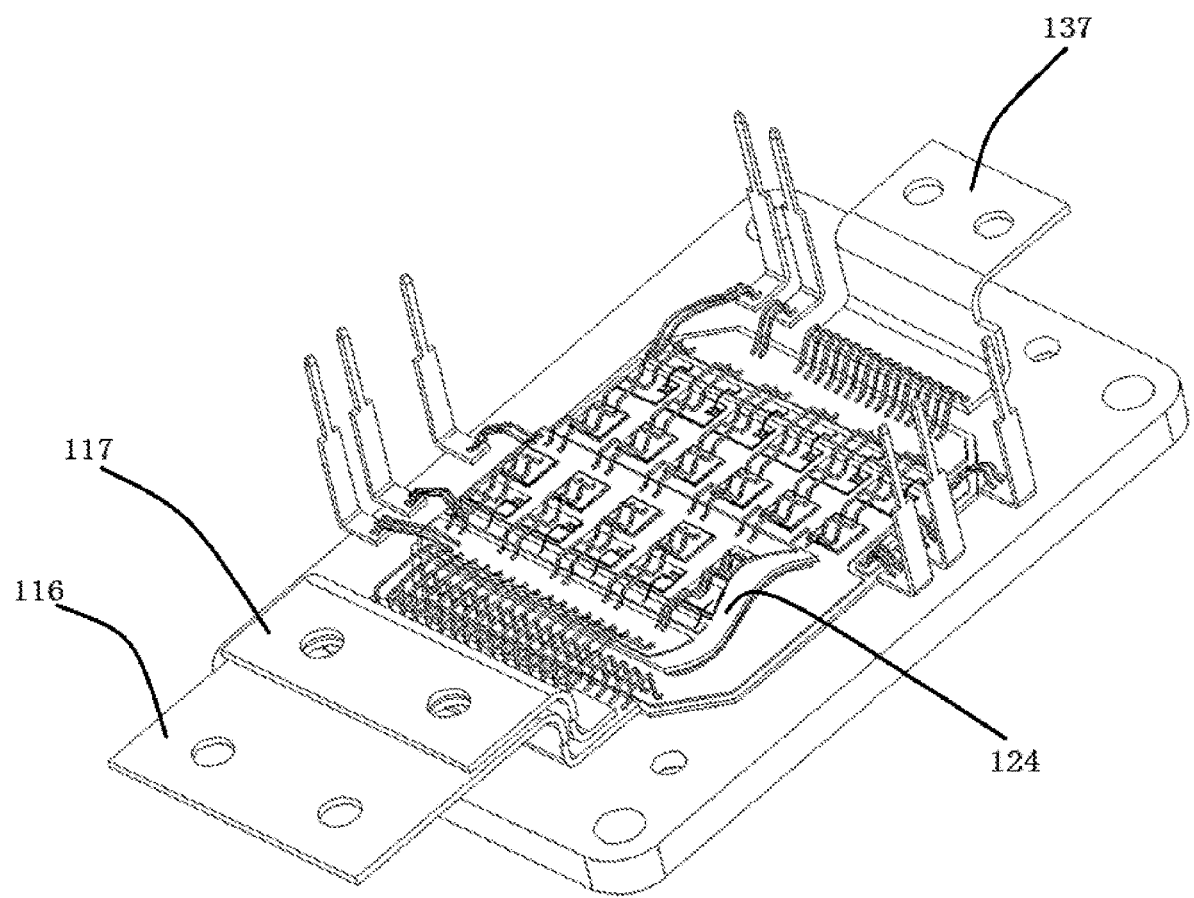
FIG. 6A, FIG. 6B and FIG. 6C are schematic diagrams of a single-face heat-dissipation structure used in the power module according to Embodiment 1 of the present invention.
Figure 6B:
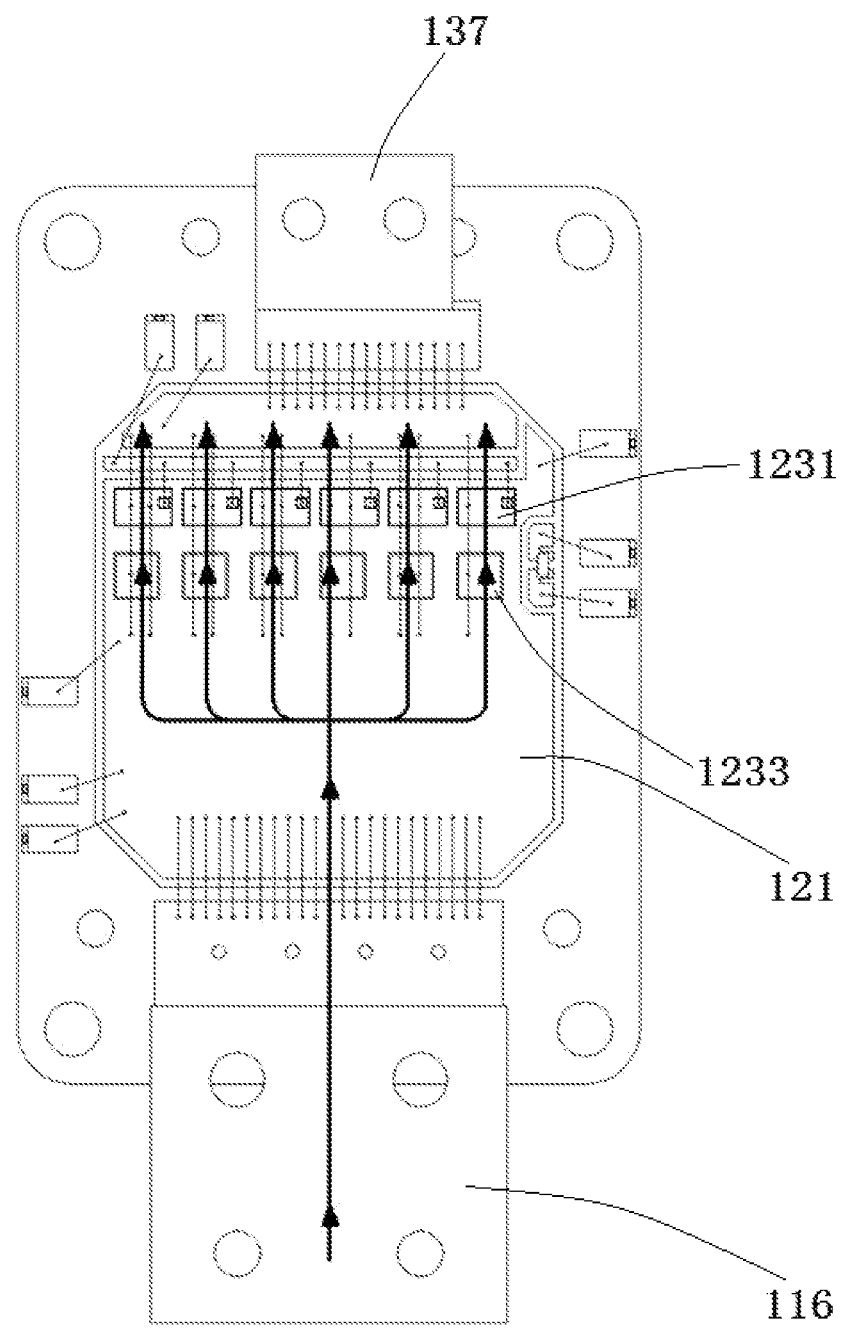
Figure 6C:
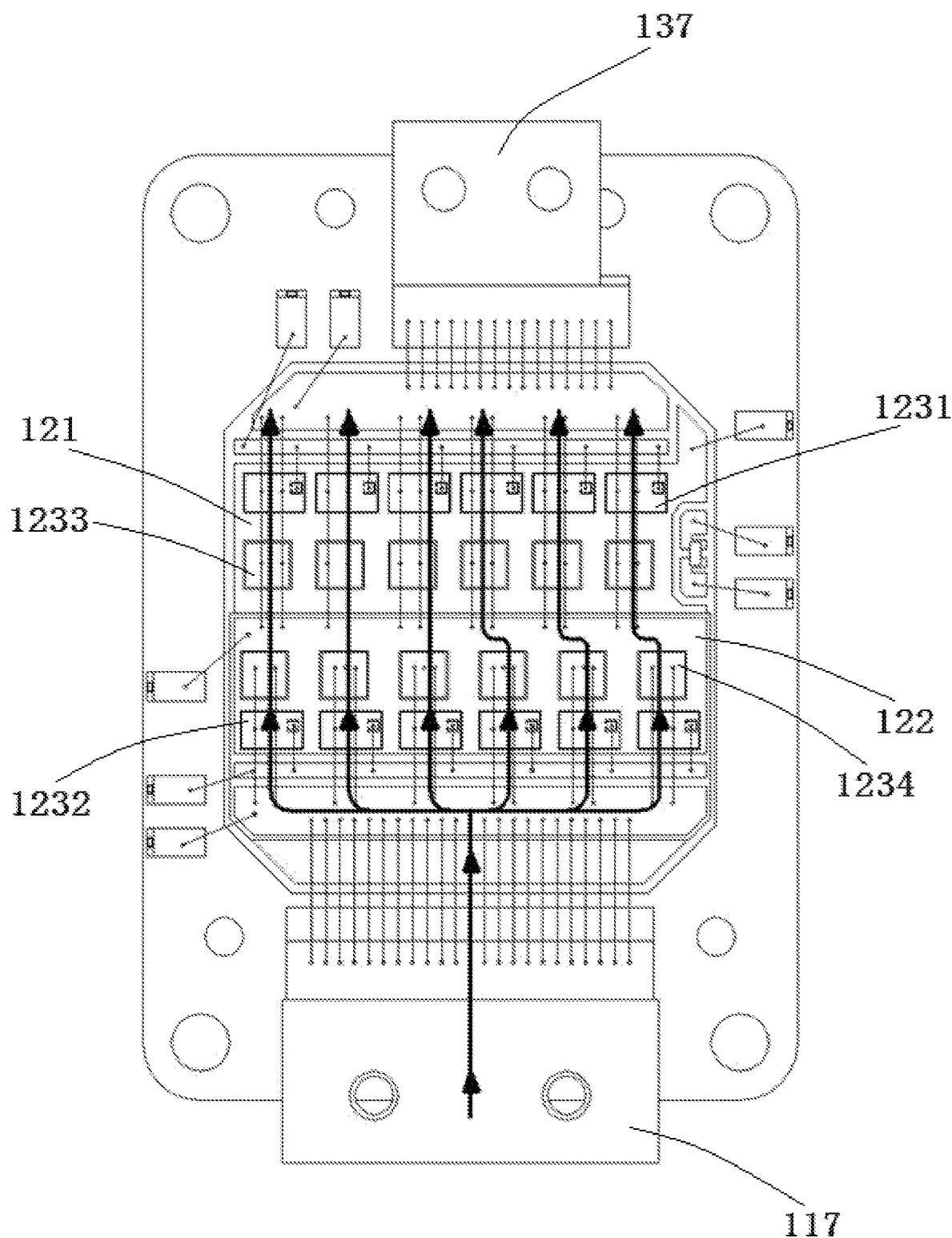

As shown in FIG. 6A, FIG. 6B and FIG. 6C, the power module is internally provided with the single-face heat-dissipation structure, including an upper half-bridge substrate 121 and a lower half-bridge substrate 122, wherein the upper half-bridge substrate 121 is provided with an upper half-bridge IGBT chip 1231 and an upper half-bridge diode chip 1233, the lower half-bridge substrate 122 is provided with a lower half-bridge IGBT chip 1232 and a lower half-bridge diode chip 1234, the first power module electrode is used as a positive electrode, the second power module electrode is used as a negative electrode, and in addition, the power module further includes an output electrode 137. The upper half-bridge substrate 121 has a three-layer structure, wherein a middle layer is an upper half-bridge substrate insulating layer, and upper and lower layers are upper half-bridge substrate metal layers. The lower half-bridge substrate 122 may have a two-layer structure, wherein an upper layer is a lower half-bridge substrate metal layer, and a lower layer is a lower half-bridge substrate insulating layer 124. The lower half-bridge substrate 122 may also have a three-layer structure, wherein a middle layer is a lower half-bridge substrate insulating layer 124, and upper and lower layers are lower half-bridge substrate metal layers. In order to better show current paths of upper and lower half bridges, the power module is split as FIG. 6B and FIG. 6C. FIG. 6(*b*) FIG. 6B shows a working current path after enabling the upper half-bridge IGBT chip 1231, the working current flows from the connecting portion 116 of the first power module electrode into the upper half-bridge substrate 121 through a bonding wire, flows through the upper half-bridge IGBT chip 1231, and then flows out to the output electrode 137 through the bonding wire. FIG. 6C shows a freewheel current path after disabling the upper half-bridge IGBT chip 1231, the freewheel current flows from the connecting portion 117 of the second power module electrode into the lower half-bridge substrate 122 through a bonding wire, flows through the lower half-bridge diode chip 1234, and then flows out to the output electrode 137 through the bonding wire. In addition, the working current path after enabling the lower half-bridge IGBT chip 1232 is as follows: the working current flows from the connecting portion 117 of the second power module electrode into the lower half-bridge substrate 122 through a bonding wire, flows through the lower half-bridge IGBT chip 1232, and then flows out to the output electrode 137 through the bonding wire; and the freewheel current path after disabling the lower half-bridge IGBT chip 1232 is as follows: the freewheel current flows from the connecting portion 116 of the first power module electrode into the upper half-bridge substrate 121 through a bonding wire, flows through the upper half-bridge diode chip 1233, and then flows out to the output electrode 137 through the bonding wire.

2. Adoption of Double-Face Heat-Dissipation Structure

Figure 7:
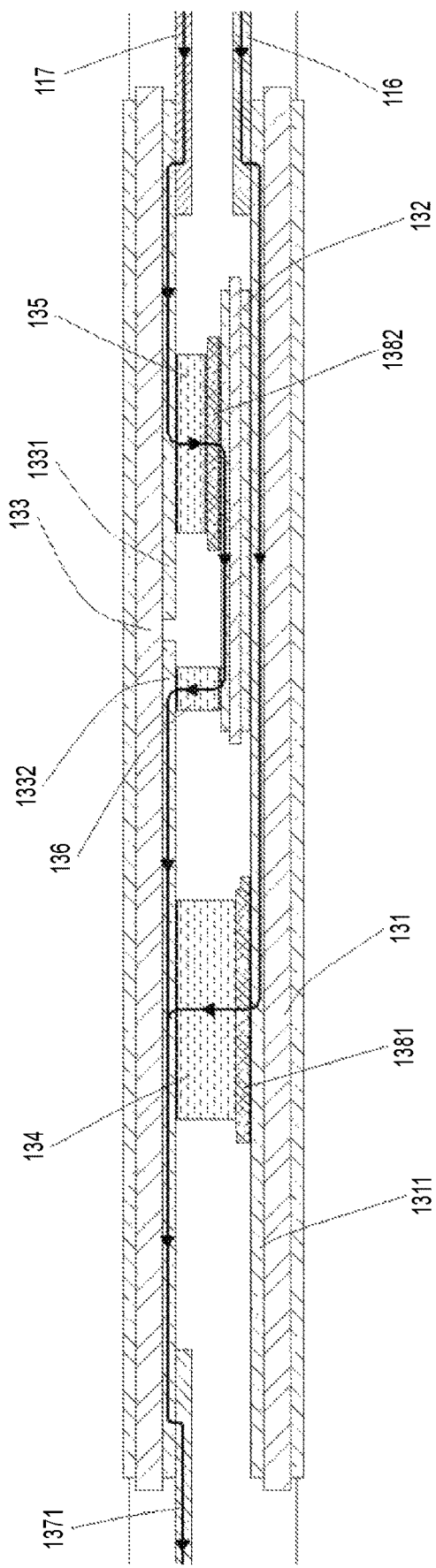
FIG. 7 is a schematic diagram of a double-face heat-dissipation structure used in the power module according to Embodiment 1 of the present invention.

As shown in FIG. 7, the power module is internally provided with the double-face heat-dissipation structure, including a bottom substrate 131, a middle substrate 132 and a top substrate 133, a copper layer on an upper surface of the bottom substrate 131 is a positive electrode copper layer 1311, and a lower surface of the top substrate 133 is provided with two copper layers separated from each other, namely a negative electrode copper layer 1331 and an output electrode copper layer 1332. The positive electrode copper layer 1311 is provided with an upper half-bridge chip 1381, a first connecting block 134 is arranged between the upper half-bridge chip 1381 and the output electrode copper layer 1332. The positive electrode copper layer 1311 is also provided with the middle substrate 132. The middle substrate 132 is also provided with a lower half-bridge chip 1382. A second connecting block 135 is arranged between the lower half-bridge chip 1382 and the negative electrode copper layer 1331, and a connecting column 136 is also arranged between the middle substrate 132 and the output electrode copper layer 1332. The first power module electrode is used as a positive electrode. The second power module electrode is used as a negative electrode, and in addition, the power module is also provided with the output electrode 137. The connecting portion 116 of the first power module electrode is connected with the positive electrode copper layer 1311. The connecting portion 117 of the second power module electrode is connected with the negative electrode copper layer 1331, and a connecting portion 1371 of the output electrode is connected with the output electrode copper layer 1332. FIG. 7 also shows a current path diagram during working and freewheeling. During working, a working current flows from the connecting portion 116 of the first power module electrode into the upper half-bridge chip 1381 through the positive electrode copper layer 1311, then flows to the output electrode copper layer 1332 through the first connecting block 134, and finally flows out from the connecting portion 1371 of the output electrode. During freewheeling, a freewheel current flows from the connecting portion 117 of the second power module electrode into the second connecting block 135 through the negative electrode copper layer 1331, then flows to the lower half-bridge chip 1382, then flows to the middle substrate 132, then flows into the output electrode copper layer 1332 through the connecting column 136, and finally flows out from the connecting portion 1371 of the output electrode.

Figure 8:
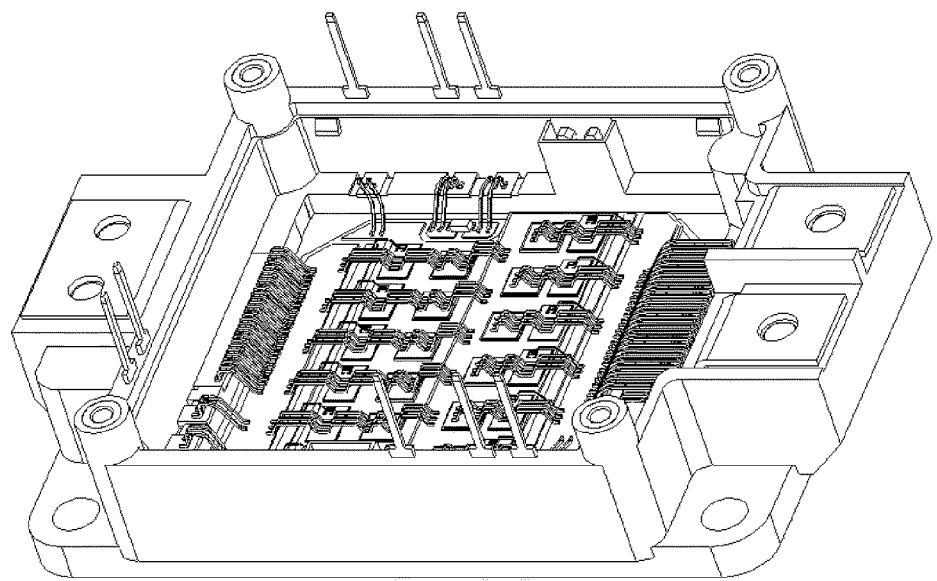
FIG. 8 is a structure diagram of a power module in the prior art.

A power module in the prior art is as shown in FIG. 8. The connecting portions of two power module electrodes are arranged side by side without overlapping. In the embodiment, simulation comparison is performed between the power module adopting the double-face heat-dissipation structure and the power module in the prior art, and simulation results are shown in Table 1.

TABLE 1

Simulation Comparison between Power Module Adopting Double-face Heat-dissipation Structure in Embodiment 1 and Power Module in the Prior Art.

| | Prior art | Embodiment 1 - power module of double-face heat dissipation |
|---|---|---|
| Stray inductance (nH) | 12.99 | 3.28 |

It may be seen from Table 1 that stray inductance of the power module in the prior art is 12.99 nH, while stray inductance of the power module of double-face heat dissipation is only 3.28 nH, that is, the Embodiment 1 greatly reduces the stray inductance, which is also a good effect brought about by adopting the parallelly installed electrodes. The stray inductance is a crucial parameter for the power module, and a magnitude of the stray inductance directly affects a performance of the power module. Generally speaking, it is very difficult to reduce the stray inductance by several nH, and it is an extremely difficult breakthrough to reduce the stray inductance by nearly 10 nH in the embodiment, which is of great significance to development of a power module industry!

Embodiment 2

Figure 9:
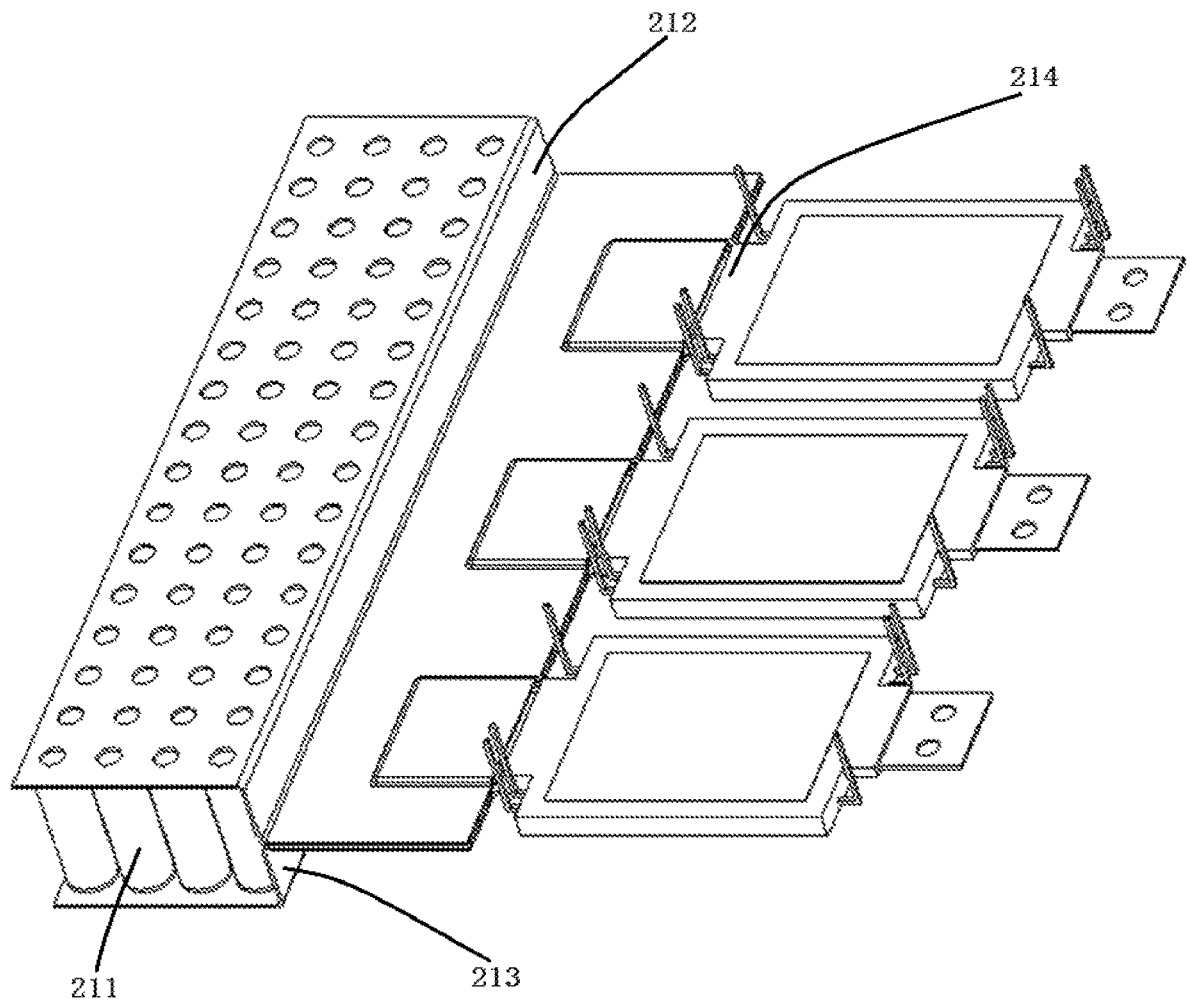
FIG. 9 is a structure diagram of a power module group according to Embodiment 2 of the present invention.
Figure 10:
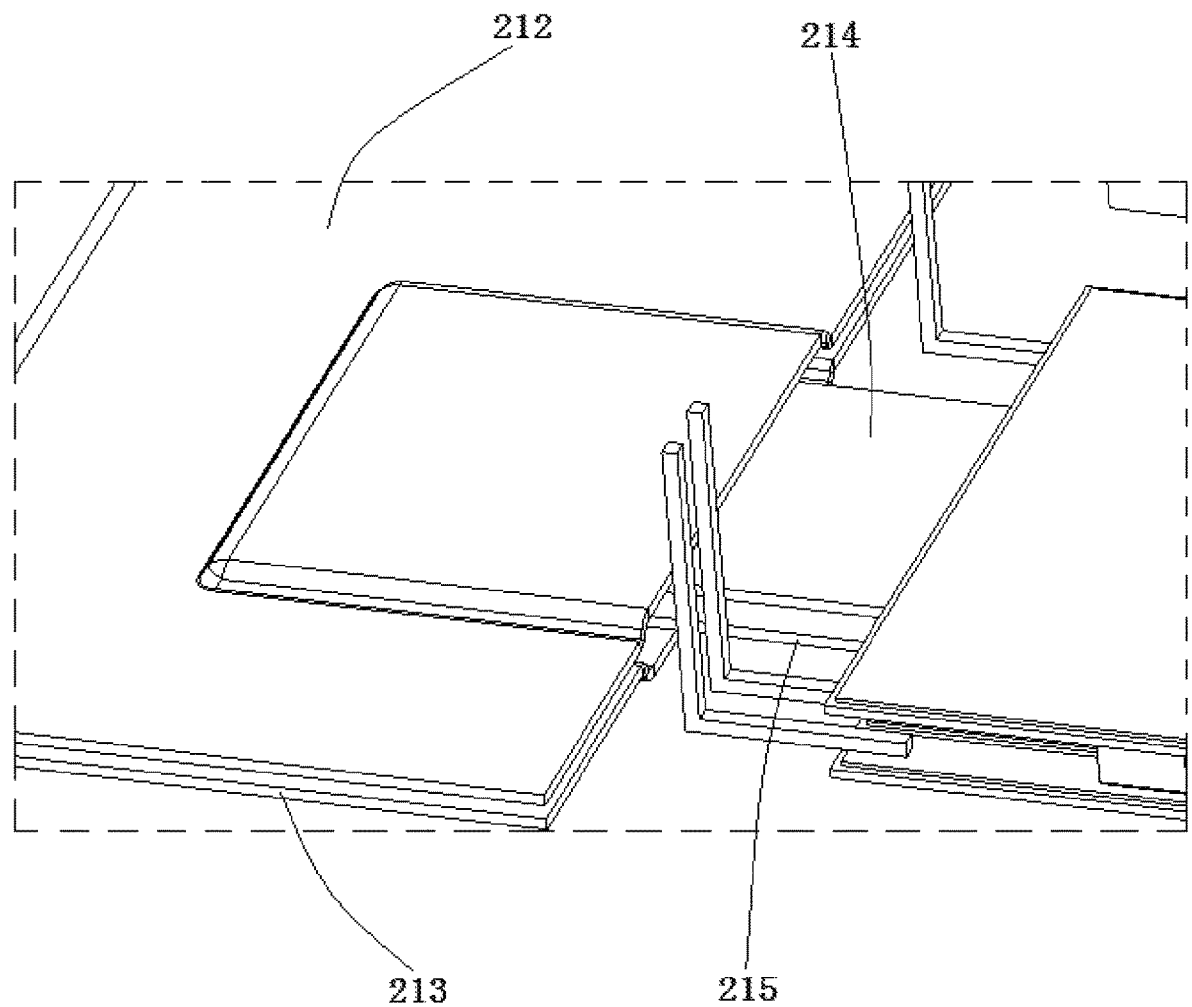
FIG. 10 is a partial enlarged diagram of the power module group according to Embodiment 2 of the present invention.

Embodiment 2 discloses a power module group with a parallel flat-plug electrode combination, as shown in FIG. 9, which includes a capacitor with a capacitor electrode combination and a power module with a power module electrode combination. The capacitor electrode combination includes a first capacitor electrode 212 and a second capacitor electrode 213. The first capacitor electrode 212 and the second capacitor electrode 213 are both plate-shaped and located in a middle of a side surface of the capacitor. The first capacitor electrode 212 and the second capacitor electrode 213 are respectively connected with positive and negative electrodes of a capacitor core group 211. As shown in FIG. 10, the first capacitor electrode 212 is partially bulged, the second capacitor electrode 213 is also partially bulge, and a bulge of the first capacitor electrode 212 and a bulge of the second capacitor electrode 213 jointly form an accommodating cavity. The power module electrode combination includes a first power module electrode and a second power module electrode. A soldering portion of the first power module electrode and a soldering portion of the second power module electrode are respectively connected with a copper layer of a power source inside the power module. A connecting portion 214 of the first power module electrode and a connecting portion 215 of the second power module electrode are opposite in parallel, and the connecting portion 214 of the first power module electrode and the connecting portion 215 of the second power module electrode may be inserted into the accommodating cavity.

The power module may be internally provided with a single-face heat-dissipation structure or a double-face heat-dissipation structure. The solutions adopting the single-face heat-dissipation structure and the double-face heat-dissipation structure are described hereinafter respectively.

1. Adoption of Single-Face Heat-Dissipation Structure

Figure 11A:
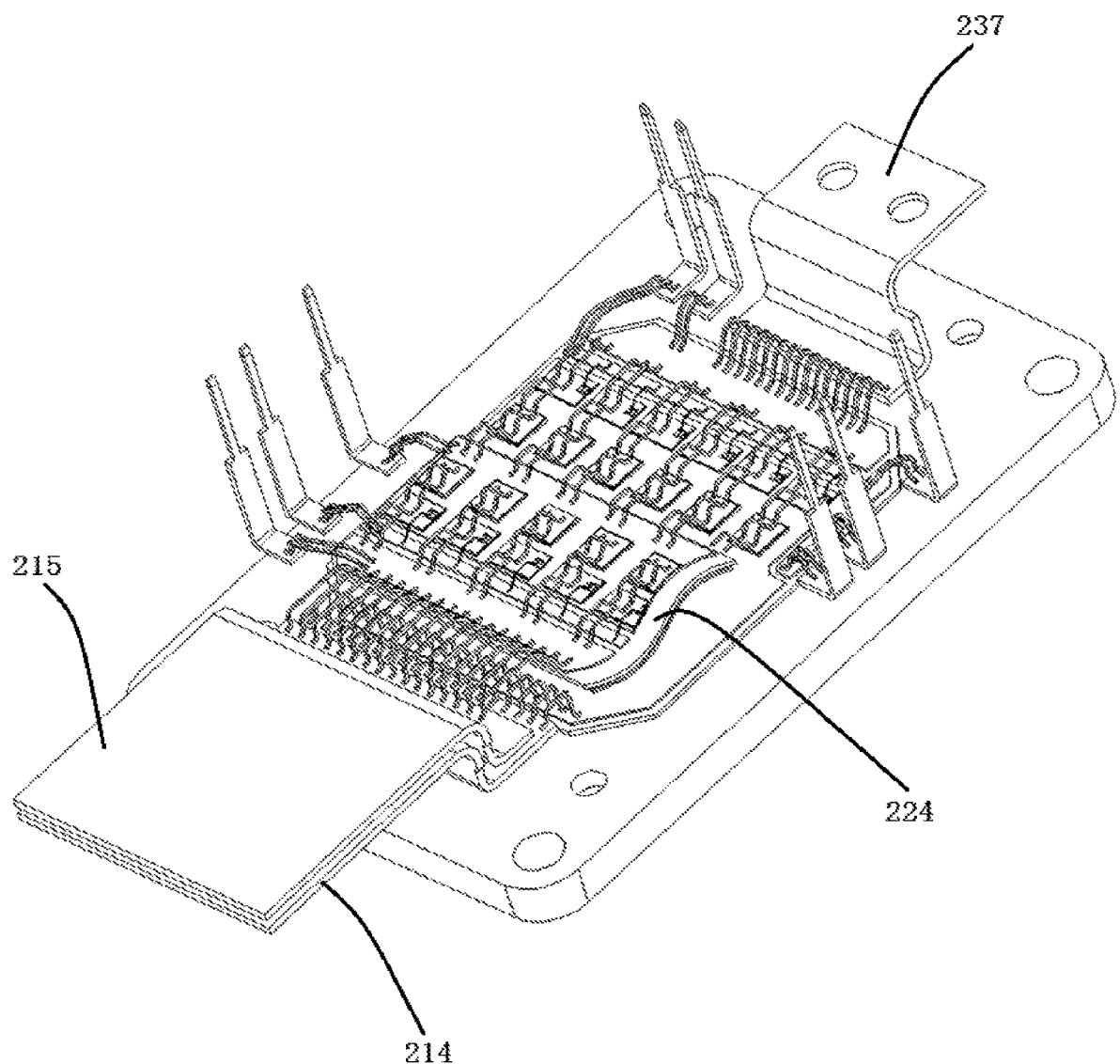
FIG. 11A, FIG. 11B, and FIG. 11C are schematic diagrams of a single-face heat-dissipation structure used in a power module according to Embodiment 2 of the present invention.
Figure 11B:
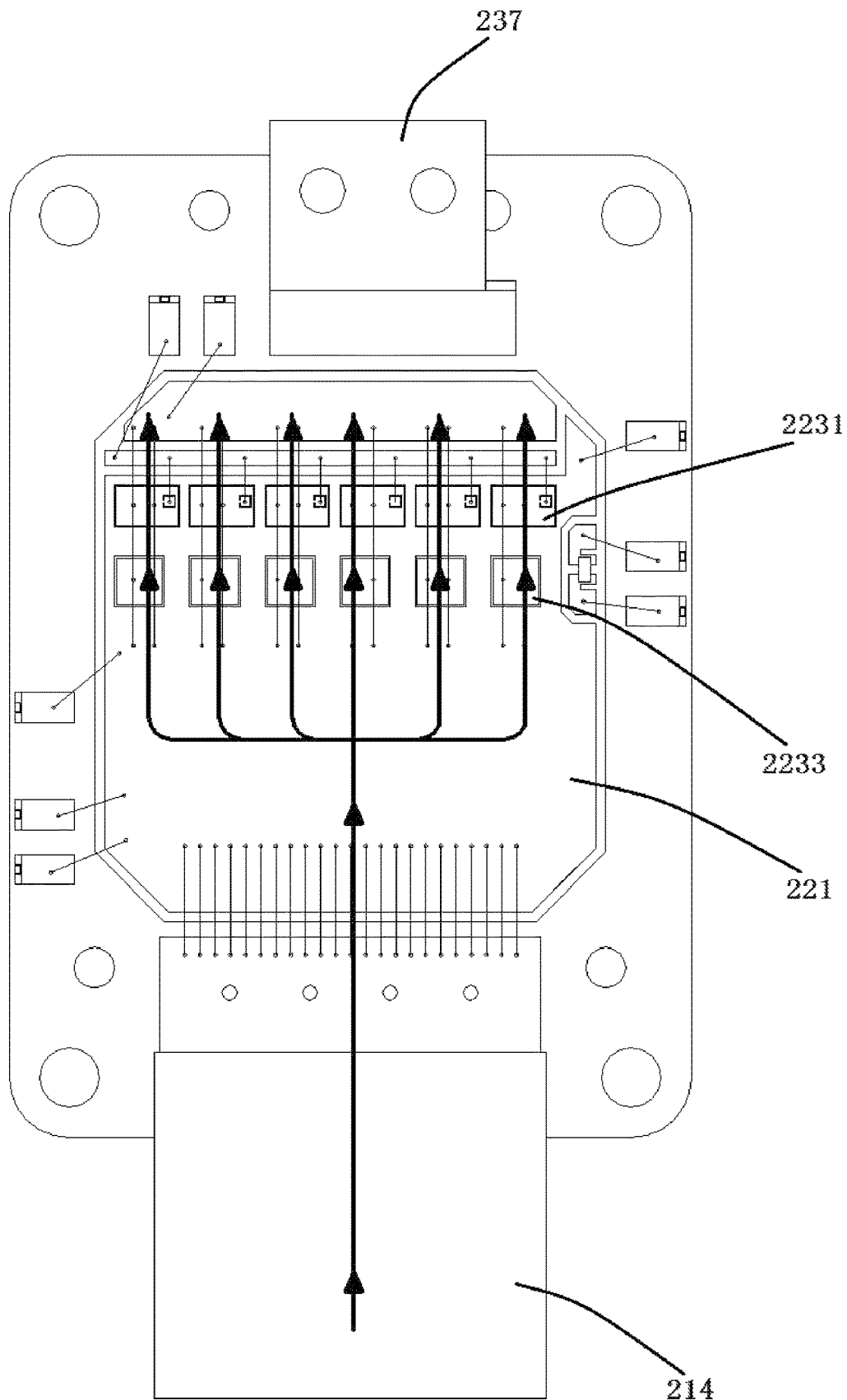
Figure 11C:
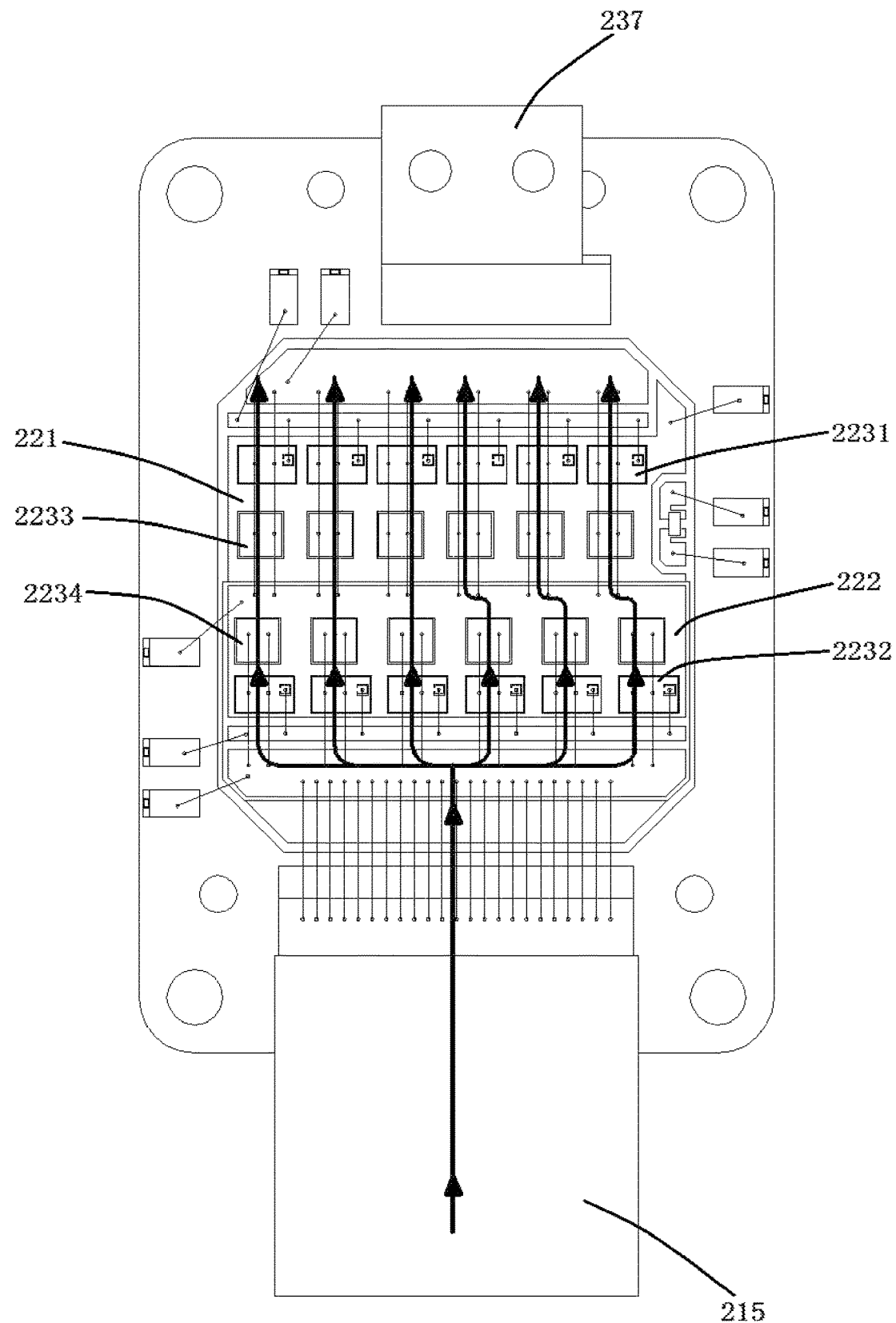

As shown in FIG. 11A, FIG. 11B and FIG. 11C, the power module is internally provided with the single-face heat-dissipation structure, including an upper half-bridge substrate 221 and a lower half-bridge substrate 222, wherein the upper half-bridge substrate 221 is provided with an upper half-bridge IGBT chip 2231 and an upper half-bridge diode chip 2233. The lower half-bridge substrate 222 is provided with a lower half-bridge IGBT chip 2232 and a lower half-bridge diode chip 2234. The first power module electrode is used as a positive electrode, the second power module electrode is used as a negative electrode, and in addition, the power module further includes an output electrode 237. The upper half-bridge substrate 221 has a three-layer structure, wherein a middle layer is an upper half-bridge substrate insulating layer, and upper and lower layers are upper half-bridge substrate metal layers. The lower half-bridge substrate 222 may have a two-layer structure, wherein an upper layer is a lower half-bridge substrate metal layer, and a lower layer is a lower half-bridge substrate insulating layer 224. The lower half-bridge substrate 222 may also have a three-layer structure, wherein a middle layer is a lower half-bridge substrate insulating layer 224, and upper and lower layers are lower half-bridge substrate metal layers. In order to better show current paths of upper and lower half bridges, the power module is split as FIG. 11B and FIG. 11C. FIG. 11B shows a working current path after enabling the upper half-bridge IGBT chip 2231. The working current flows from the connecting portion 214 of the first power module electrode into the upper half-bridge substrate 221 through a bonding wire, flows through the upper half-bridge IGBT chip 2231, and then flows out to the output electrode 237 through the bonding wire. FIG. 11C shows a freewheel current path after disabling the upper half-bridge IGBT chip 2231. The freewheel current flows from the connecting portion 215 of the second power module electrode into the lower half-bridge substrate 222 through a bonding wire, flows through the lower half-bridge diode chip 2234, and then flows out to the output electrode 237 through the bonding wire. In addition, the working current path after enabling the lower half-bridge IGBT chip 2232 is as follows: the working current flows from the connecting portion 215 of the second power module electrode into the lower half-bridge substrate 222 through a bonding wire, flows through the lower half-bridge IGBT chip 2232, and then flows out to the output electrode 237 through the bonding wire; and the freewheel current path after disabling the lower half-bridge IGBT chip 2232 is as follows: the freewheel current flows from the connecting portion 214 of the first power module electrode into the upper half-bridge substrate 221 through a bonding wire, flows through the upper half-bridge diode chip 2233, and then flows out to the output electrode 237 through the bonding wire.

2. Adoption of Double-Face Heat-Dissipation Structure

Figure 12:
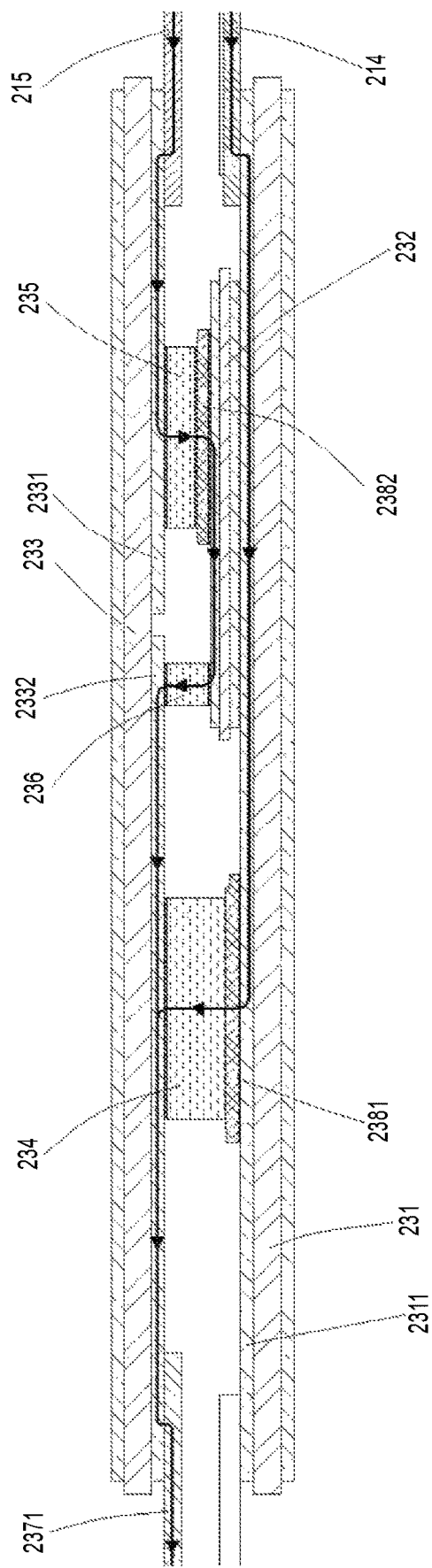
FIG. 12 is a schematic diagram of a double-face heat-dissipation structure used in the power module according to Embodiment 2 of the present invention.

As shown in FIG. 12, the power module is internally provided with the double-face heat-dissipation structure, including a bottom substrate 231, a middle substrate 232 and a top substrate 233. A copper layer on an upper surface of the bottom substrate 231 is a positive electrode copper layer 2311, and a lower surface of the top substrate 233 is provided with two copper layers separated from each other, namely a negative electrode copper layer 2331 and an output electrode copper layer 2332. The positive electrode copper layer 2311 is provided with an upper half-bridge chip 2381. A first connecting block 234 is arranged between the upper half-bridge chip 2381 and the output electrode copper layer 2332. The positive electrode copper layer 2311 is also provided with the middle substrate 232. The middle substrate 232 is also provided with a lower half-bridge chip 2382. A second connecting block 235 is arranged between the lower half-bridge chip 2382 and the negative electrode copper layer 2331, and a connecting column 236 is also arranged between the middle substrate 232 and the output electrode copper layer 2332. The first power module electrode is used as a positive electrode, the second power module electrode is used as a negative electrode, and in addition, the power module is also provided with the output electrode 237. The connecting portion 216 of the first power module electrode is connected with the positive electrode copper layer 2311, the connecting portion 217 of the second power module electrode is connected with the negative electrode copper layer 2331, and a connecting portion 2371 of the output electrode is connected with the output electrode copper layer 2332. FIG. 12 also shows a current path diagram during working and freewheeling. During working, a working current flows from the connecting portion 216 of the first power module electrode into the upper half-bridge chip 2381 through the positive electrode copper layer 2311, then flows to the output electrode copper layer 2332 through the first connecting block 234, and finally flows out from the connecting portion 2371 of the output electrode. During freewheeling, a freewheel current flows from the connecting portion 217 of the second power module electrode into the second connecting block 235 through the negative electrode copper layer 2331, then flows to the lower half-bridge chip 2382, then flows to the middle substrate 232, then flows into the output electrode copper layer 2332 through the connecting column 236, and finally flows out from the connecting portion 2371 of the output electrode.

A power module in the prior art is as shown in FIG. 8. The connecting portions of two power module electrodes are arranged side by side without overlapping. In the embodiment, simulation comparison is performed between the power module adopting the double-face heat-dissipation structure and the power module in the prior art, and simulation results are shown in Table 2.

TABLE 2

Simulation Comparison between Power Module Adopting Double-face Heat-dissipation Structure in Embodiment 2 and Power Module in the Prior Art.

| | Prior art | Embodiment 2 - power module of double-face heat dissipation |
|---|---|---|
| Stray inductance (nH) | 12.99 | 3.43 |

It may be seen from Table 2 that stray inductance of the power module in the prior art is 12.99 nH, while stray inductance of the power module of double-face heat dissipation is only 3.43 nH, that is, the Embodiment 2 greatly reduces the stray inductance, which is also a good effect brought about by adopting the parallelly installed electrodes. The stray inductance is a crucial parameter for the power module, and a magnitude of the stray inductance directly affects a performance of the power module. Generally speaking, it is very difficult to reduce the stray inductance by several nH, and it is an extremely difficult breakthrough to reduce the stray inductance by nearly 10 nH in the embodiment, which is of great significance to development of a power module industry!

Embodiment 3

Figure 13:
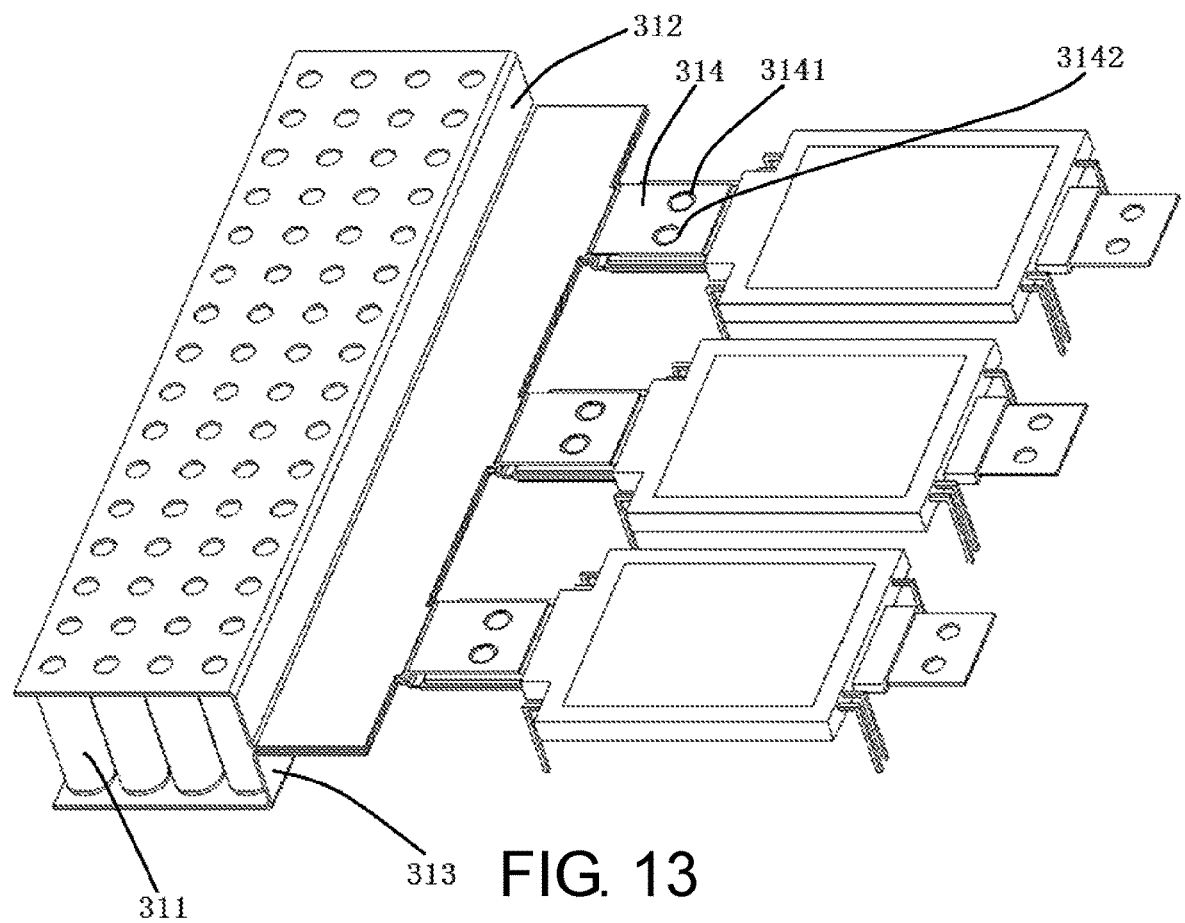
FIG. 13 is a structure diagram of a power module group according to Embodiment 3 of the present invention.
Figure 14:
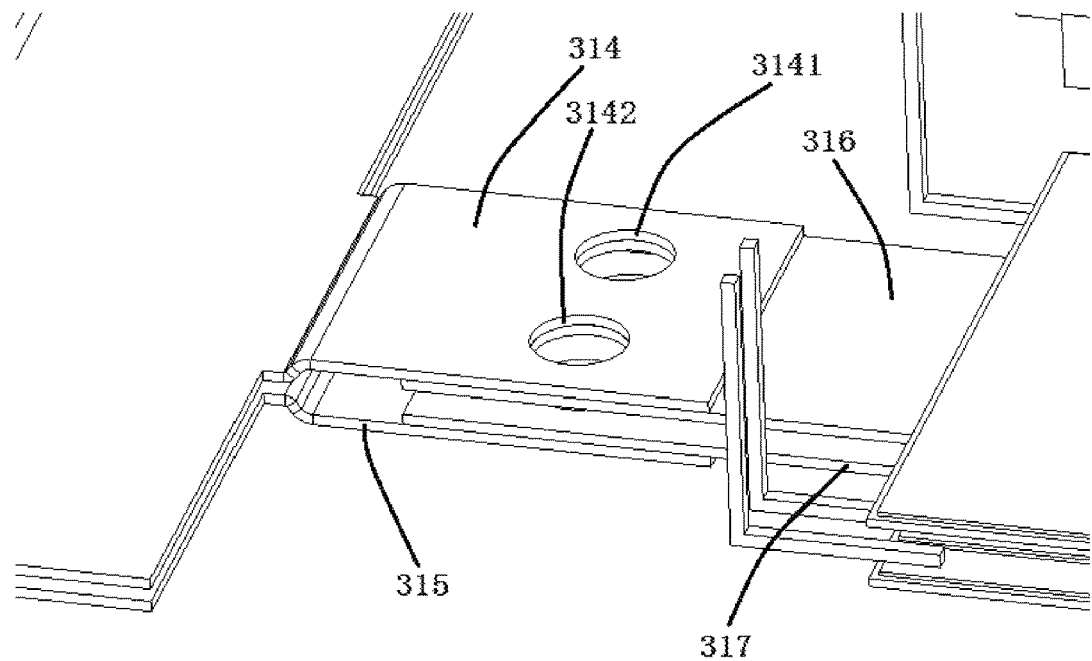
FIG. 14 is a partial enlarged diagram of the power module group according to Embodiment 3 of the present invention.
Figure 15:
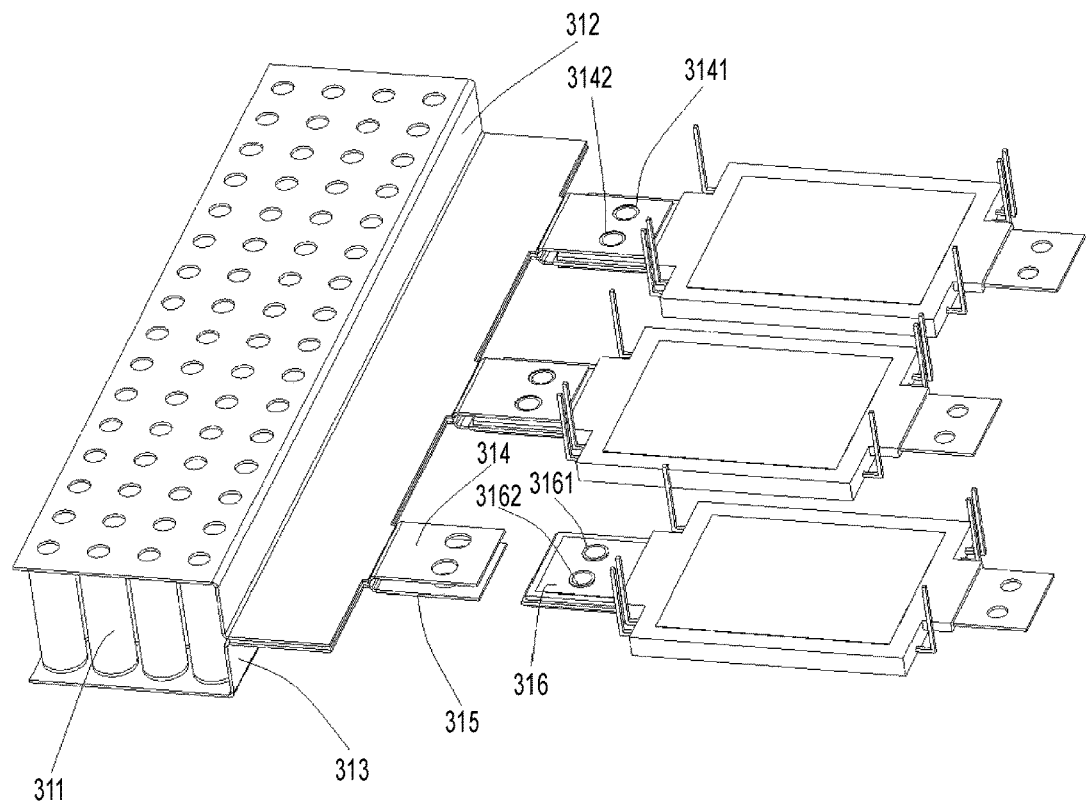
FIG. 15 is a separation diagram of the power module group according to Embodiment 3 of the present invention.

Embodiment 3 discloses a power module group with a parallel coaxially-installed electrode combination, as shown in FIG. 13, which includes a capacitor with a capacitor electrode combination and a power module with a power module electrode combination. The capacitor electrode combination includes a first capacitor electrode and a second capacitor electrode. A soldering portion 312 of the first capacitor electrode and a soldering portion 313 of the second capacitor electrode are respectively connected with positive and negative electrodes of a capacitor core group 311. The soldering portion 312 of the first capacitor electrode leads out a connecting portion 314 of the first capacitor electrode, and the soldering portion 313 of the second capacitor electrode leads out a connecting portion 315 of the second capacitor electrode. The soldering portion 312 of the first capacitor electrode and the soldering portion 313 of the second capacitor electrode are both plate-shaped and located in a middle of a side surface of the capacitor. The connecting portion 314 of the first capacitor electrode and the connecting portion 315 of the second capacitor electrode are opposite in parallel. As shown in FIG. 14, the connecting portion 314 of the first capacitor electrode is provided with a first connecting hole 3141 and a second connecting hole 3142, and the connecting portion 315 of the second capacitor electrode is provided with a third connecting hole and a fourth connecting hole. The power module electrode combination includes a first power module electrode and a second power module electrode. A soldering portion of the first power module electrode and a soldering portion of the second power module electrode are respectively connected with a copper layer of a power source inside the power module. The soldering portion of the first power module electrode leads out a connecting portion 316 of the first power module electrode. The soldering portion of the second power module electrode leads out a connecting portion 317 of the second power module electrode. The connecting portion 316 of the first power module electrode and the connecting portion 317 of the second power module electrode are opposite in parallel. As shown in FIG. 15, the connecting portion 316 of the first power module electrode is provided with a fifth connecting hole 3161 and a sixth connecting hole 3162, and the connecting portion 317 of the second power module electrode is provided with a seventh connecting hole and an eighth connecting hole. In addition, the first connecting hole 3141, the fifth connecting hole 3161, the seventh connecting hole and the third connecting hole are all coaxially arranged, and the second connecting hole 3142, the sixth connecting hole 3162, the eighth connecting hole and the fourth connecting hole are all coaxially arranged.

The power module may be internally provided with a single-face heat-dissipation structure or a double-face heat-dissipation structure. The solutions adopting the single-face heat-dissipation structure and the double-face heat-dissipation structure are described hereinafter respectively.

1. Adoption of Single-Face Heat-Dissipation Structure

Figure 16A:
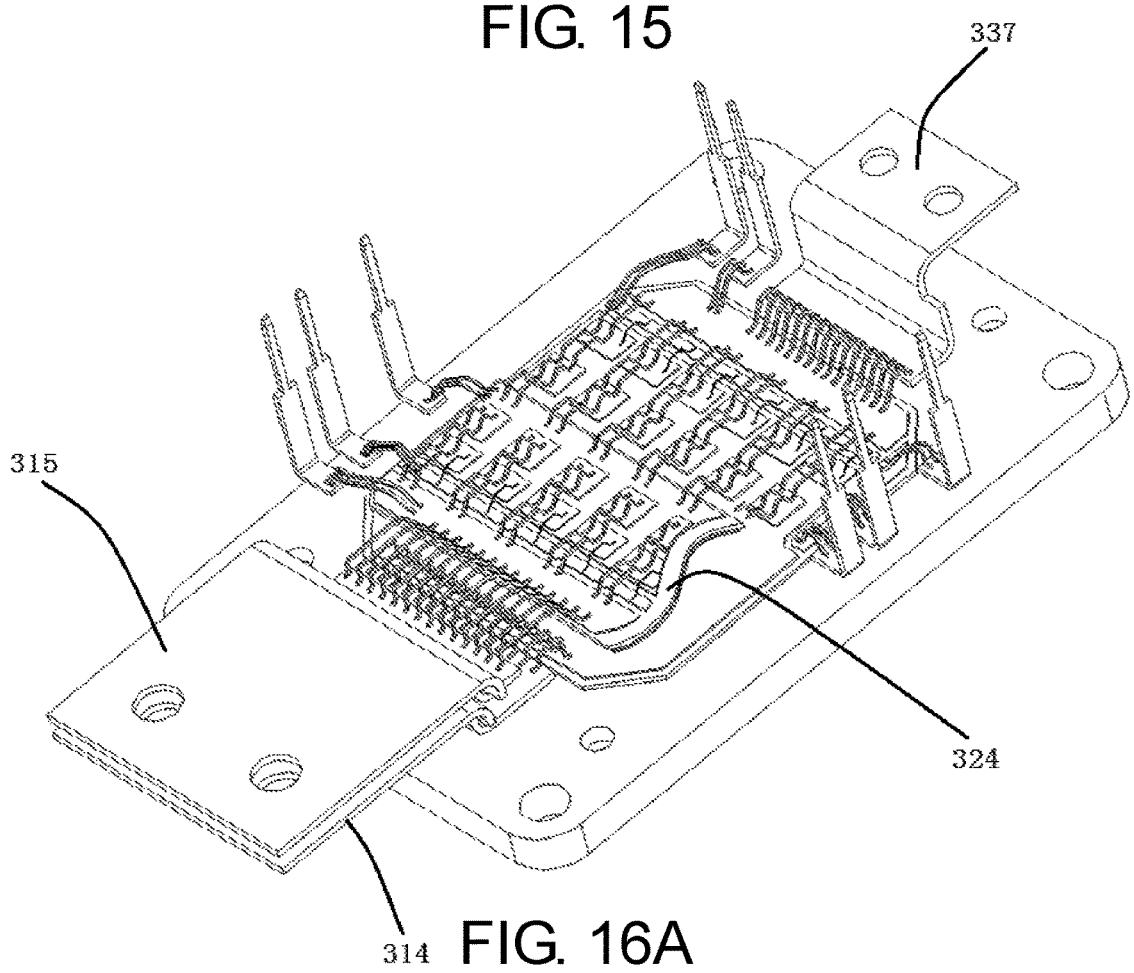
FIG. 16A, FIG. 16B, and FIG. 16C are schematic diagrams of a single-face heat-dissipation structure used in a power module according to Embodiment 3 of the present invention.
Figure 16B:
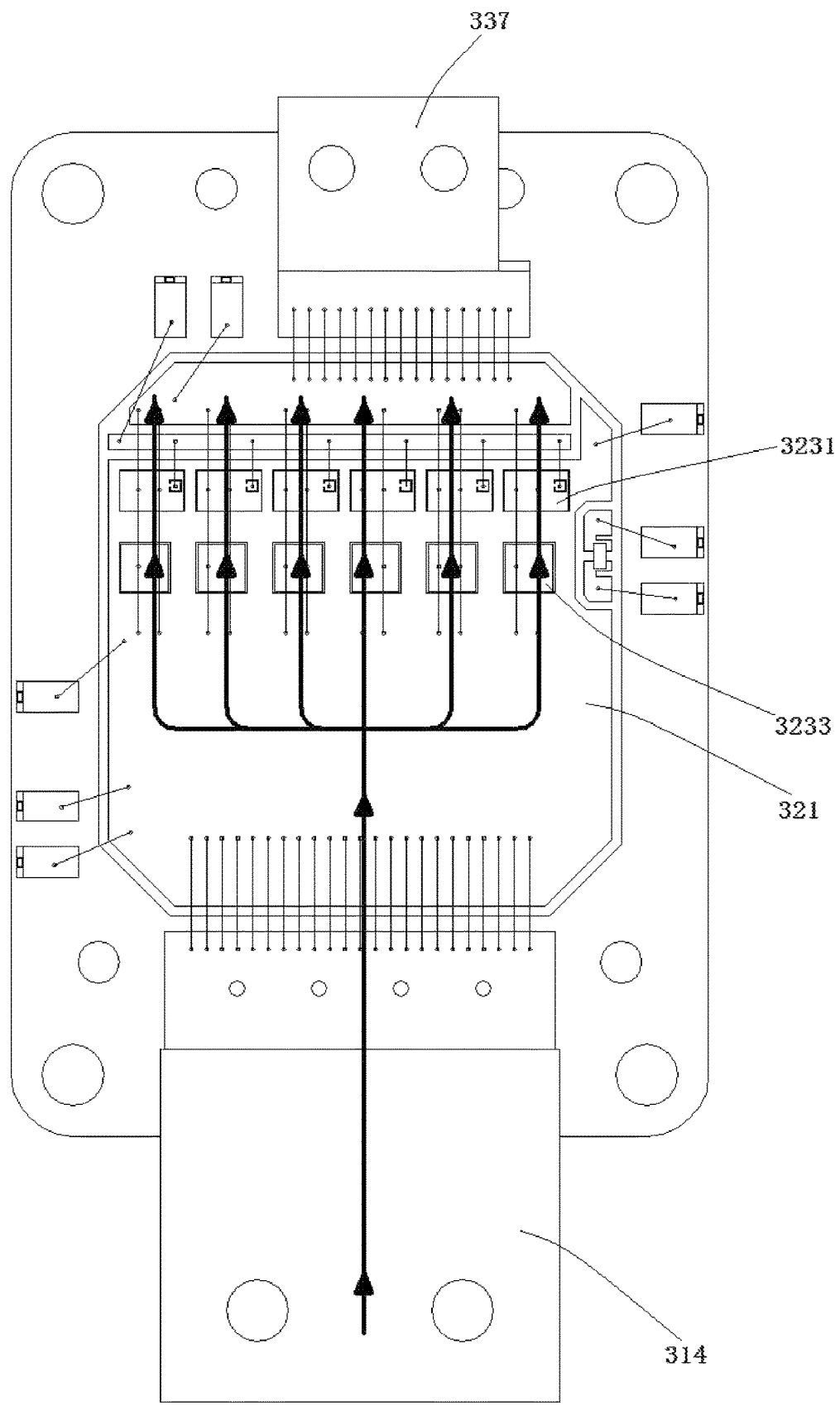
Figure 16C:
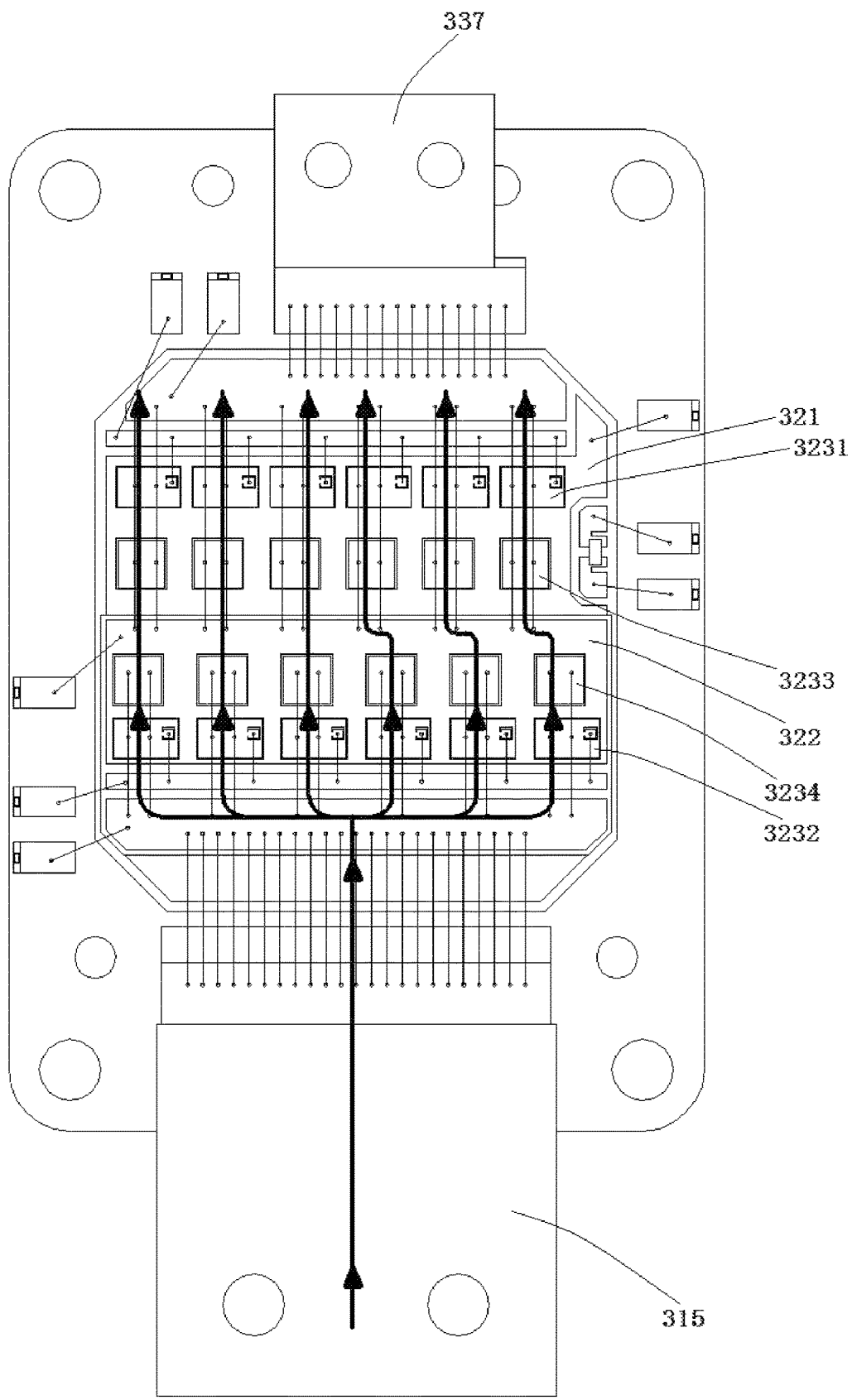

As shown in FIG. 16A, FIG. 16B and FIG. 16C, the power module is internally provided with the single-face heat-dissipation structure, including an upper half-bridge substrate 321 and a lower half-bridge substrate 322, wherein the upper half-bridge substrate 321 is provided with an upper half-bridge IGBT chip 3231 and an upper half-bridge diode chip 3233. The lower half-bridge substrate 322 is provided with a lower half-bridge IGBT chip 3232 and a lower half-bridge diode chip 3234. The first power module electrode is used as a positive electrode, the second power module electrode is used as a negative electrode, and in addition, the power module further includes an output electrode 337. The upper half-bridge substrate 321 has a three-layer structure, wherein a middle layer is an upper half-bridge substrate insulating layer, and upper and lower layers are upper half-bridge substrate metal layers. The lower half-bridge substrate 322 may have a two-layer structure, wherein an upper layer is a lower half-bridge substrate metal layer, and a lower layer is a lower half-bridge substrate insulating layer 324. The lower half-bridge substrate 322 may also have a three-layer structure, wherein a middle layer is a lower half-bridge substrate insulating layer 324, and upper and lower layers are lower half-bridge substrate metal layers. In order to better show current paths of upper and lower half bridges, the power module is split as FIG. 16B and FIG. 16C. FIG. 16B shows a working current path after enabling the upper half-bridge IGBT chip 3231. The working current flows from the connecting portion 314 of the first power module electrode into the upper half-bridge substrate 321 through a bonding wire, flows through the upper half-bridge IGBT chip 3231, and then flows out to the output electrode 337 through the bonding wire. FIG. 16C shows a freewheel current path after disabling the upper half-bridge IGBT chip 3231. The freewheel current flows from the connecting portion 315 of the second power module electrode into the lower half-bridge substrate 122 through a bonding wire, flows through the lower half-bridge diode chip 3234, and then flows out to the output electrode 337 through the bonding wire. In addition, the working current path after enabling the lower half-bridge IGBT chip 3232 is as follows: the working current flows from the connecting portion 315 of the second power module electrode into the lower half-bridge substrate 322 through a bonding wire, flows through the lower half-bridge IGBT chip 3232, and then flows out to the output electrode 337 through the bonding wire; and the freewheel current path after disabling the lower half-bridge IGBT chip 3232 is as follows: the freewheel current flows from the connecting portion 314 of the first power module electrode into the upper half-bridge substrate 321 through a bonding wire, flows through the upper half-bridge diode chip 3233, and then flows out to the output electrode 337 through the bonding wire.

2. Adoption of Double-Face Heat-Dissipation Structure

Figure 17:
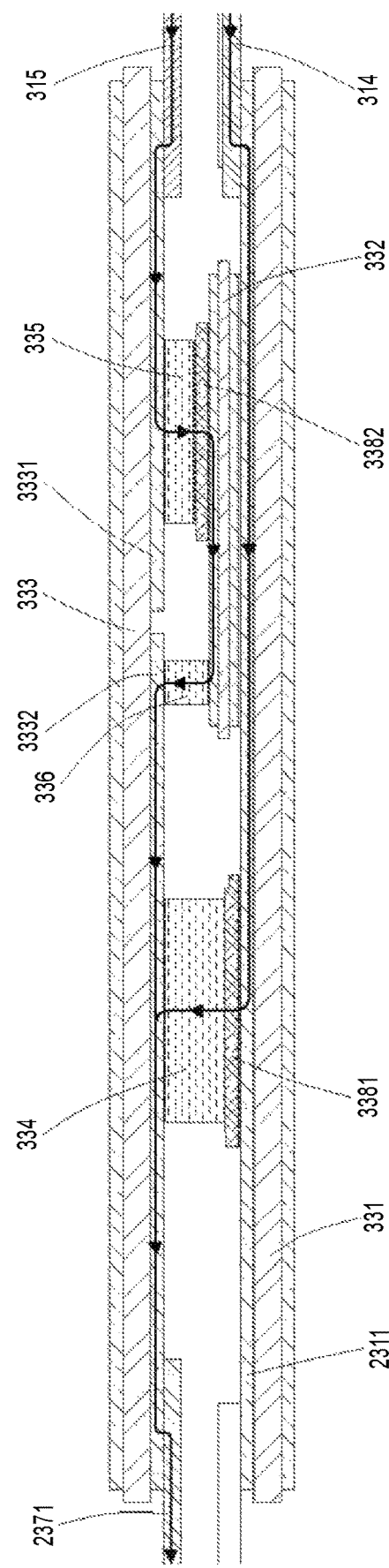
FIG. 17 is a schematic diagram of a double-face heat-dissipation structure used in the power module according to Embodiment 3 of the present invention.

As shown in FIG. 17, the power module is internally provided with the double-face heat-dissipation structure, including a bottom substrate 331, a middle substrate 332 and a top substrate 333. A copper layer on an upper surface of the bottom substrate 331 is a positive electrode copper layer 3311, and a lower surface of the top substrate 333 is provided with two copper layers separated from each other, namely a negative electrode copper layer 3331 and an output electrode copper layer 3332. The positive electrode copper layer 3311 is provided with an upper half-bridge chip 3381. A first connecting block 334 is arranged between the upper half-bridge chip 3381 and the output electrode copper layer 3332. The positive electrode copper layer 3311 is also provided with the middle substrate 332. The middle substrate 332 is also provided with a lower half-bridge chip 3382. A second connecting block 335 is arranged between the lower half-bridge chip 3382 and the negative electrode copper layer 3331, and a connecting column 336 is also arranged between the middle substrate 332 and the output electrode copper layer 3332. The first power module electrode is used as a positive electrode, the second power module electrode is used as a negative electrode, and in addition, the power module is also provided with the output electrode 337. The connecting portion 316 of the first power module electrode is connected with the positive electrode copper layer 3311. The connecting portion 317 of the second power module electrode is connected with the negative electrode copper layer 3331, and a connecting portion 3371 of the output electrode is connected with the output electrode copper layer 3332. FIG. 17 also shows a current path diagram during working and freewheeling. During working, a working current flows from the connecting portion 316 of the first power module electrode into the upper half-bridge chip 3381 through the positive electrode copper layer 3311, then flows to the output electrode copper layer 3332 through the first connecting block 334, and finally flows out from the connecting portion 3371 of the output electrode. During freewheeling, a freewheel current flows from the connecting portion 317 of the second power module electrode into the second connecting block 335 through the negative electrode copper layer 3331, then flows to the lower half-bridge chip 3382, then flows to the middle substrate 332, then flows into the output electrode copper layer 3332 through the connecting column 336, and finally flows out from the connecting portion 3371 of the output electrode.

A power module in the prior art is as shown in FIG. 8. The connecting portions of two power module electrodes are arranged side by side without overlapping. In the embodiment, simulation comparison is performed between the power module adopting the double-face heat-dissipation structure and the power module in the prior art, and simulation results are shown in Table 3.

TABLE 3

Simulation Comparison between Power Module Adopting Double-face Heat-dissipation Structure in Embodiment 3 and Power Module in the Prior Art.

| | Prior art | Embodiment 3 - power module of double-face heat dissipation |
|---|---|---|
| Stray inductance (nH) | 12.99 | 3.27 |

It may be seen from Table 3 that stray inductance of the power module in the prior art is 12.99 nH, while stray inductance of the power module of double-face heat dissipation is only 3.27 nH, that is, the Embodiment 3 greatly reduces the stray inductance, which is also a good effect brought about by adopting the parallelly installed electrodes. The stray inductance is a crucial parameter for the power module, and a magnitude of the stray inductance directly affects a performance of the power module. Generally speaking, it is very difficult to reduce the stray inductance by several nH, and it is an extremely difficult breakthrough to reduce the stray inductance by nearly 10 nH in the embodiment, which is of great significance to development of a power module industry!

Embodiment 4

Figure 18:
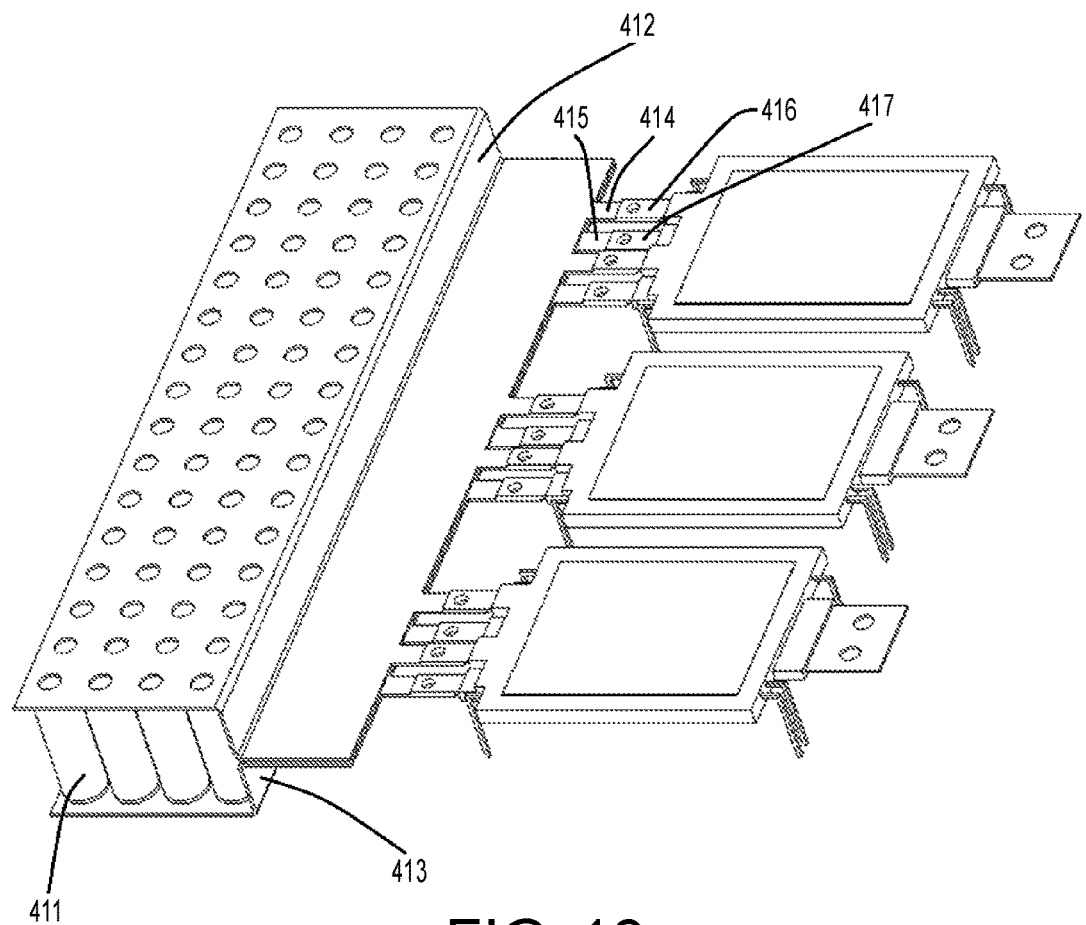
FIG. 18 is a structure diagram of a power module group according to Embodiment 4 of the present invention.
Figure 19:
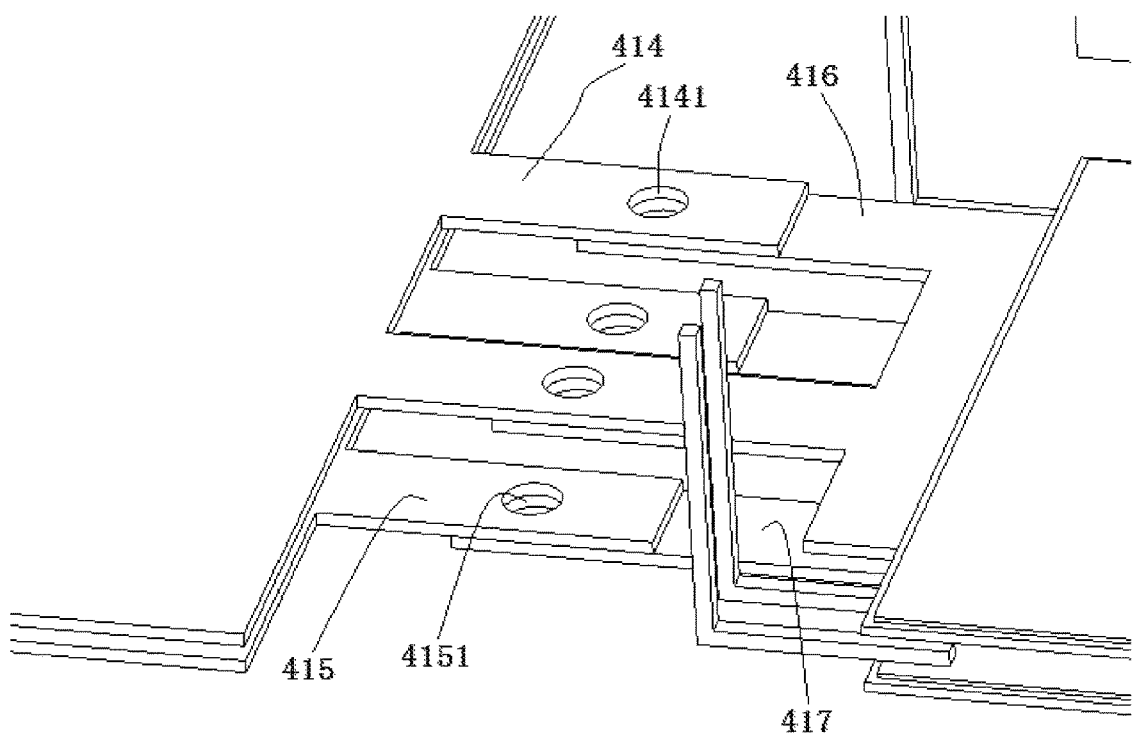
FIG. 19 is a partial enlarged diagram of the power module group according to Embodiment 4 of the present invention.
Figure 20:
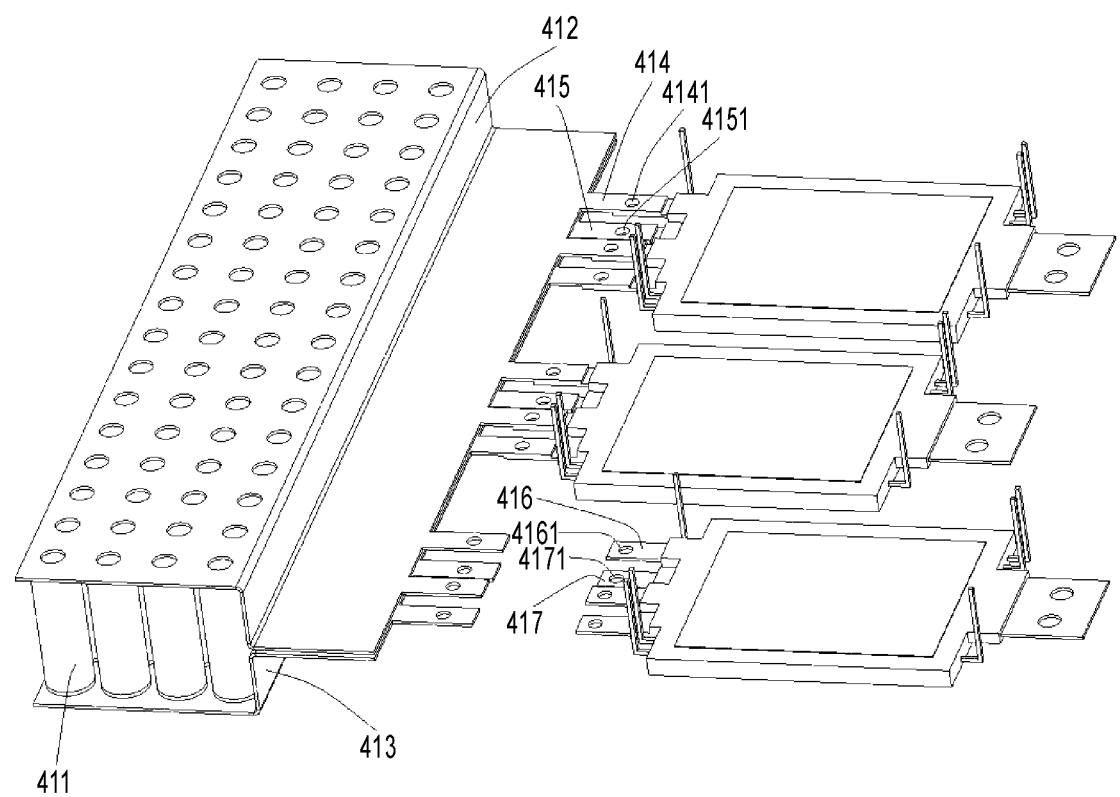
FIG. 20 is a separation diagram of the power module group according to Embodiment 4 of the present invention.

Embodiment 4 discloses a power module group with a crossed electrode combination, as shown in FIG. 18, which includes a capacitor with a capacitor electrode combination and a power module with a power module electrode combination. The capacitor electrode combination includes a first capacitor electrode and a second capacitor electrode. The first capacitor electrode and the second capacitor electrode are both plate-shaped and located in a middle of a side surface of the capacitor, and the first capacitor electrode and the second capacitor electrode are respectively connected with positive and negative electrodes of a capacitor core group 411. As shown in FIG. 18 and FIG. 19, a soldering portion 412 of the first capacitor electrode leads out a plurality of connecting portions 414 of the first capacitor electrode. The connecting portion 414 of the first capacitor electrode is provided with a first connecting hole 4141. A soldering portion 413 of the second capacitor electrode leads out a plurality of connecting portions 415 of the second capacitor electrode. The connecting portion 415 of the second capacitor electrode is provided with a second connecting hole 4151, and the connecting portion 414 of the first capacitor electrode and the connecting portion 415 of the second capacitor electrode are arranged in parallel and crossed with each other. The power module electrode combination includes a first power module electrode and a second power module electrode. As shown in FIG. 20, a soldering portion of the first power module electrode leads out a plurality of connecting portions 416 of the first power module electrode. The connecting portion 416 of the first power module electrode is provided with a third connecting hole 4161. A soldering portion of the second power module electrode leads out a plurality of connecting portions 417 of the second power module electrode, The connecting portion 417 of the second power module electrode is provided with a fourth connecting hole 4171, and the connecting portion 416 of the first power module electrode and the connecting portion 417 of the second power module electrode are arranged in parallel and crossed with each other. Moreover, the first connecting hole 4141 and the third connecting hole 4161 are coaxially arranged, and the second connecting hole 4151 and the fourth connecting hole 4171 are coaxially arranged.

The power module may be internally provided with a single-face heat-dissipation structure or a double-face heat-dissipation structure. The solutions adopting the single-face heat-dissipation structure and the double-face heat-dissipation structure are described hereinafter respectively.

1. Adoption of Single-Face Heat-Dissipation Structure

Figure 21A:
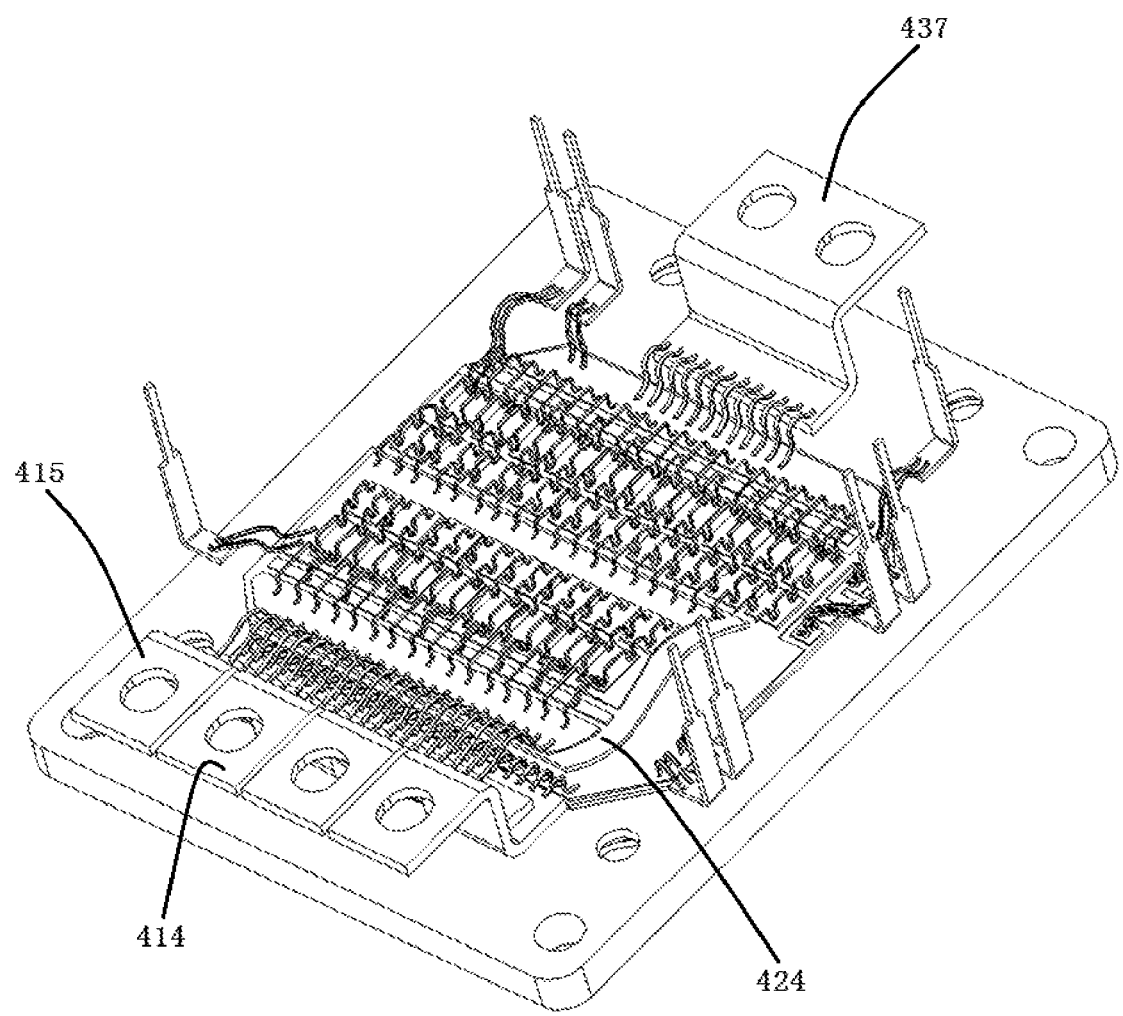
FIG. 21A, FIG. 21B, and FIG. 21C are schematic diagrams of a single-face heat-dissipation structure used in a power module according to Embodiment 4 of the present invention.
Figure 21B:
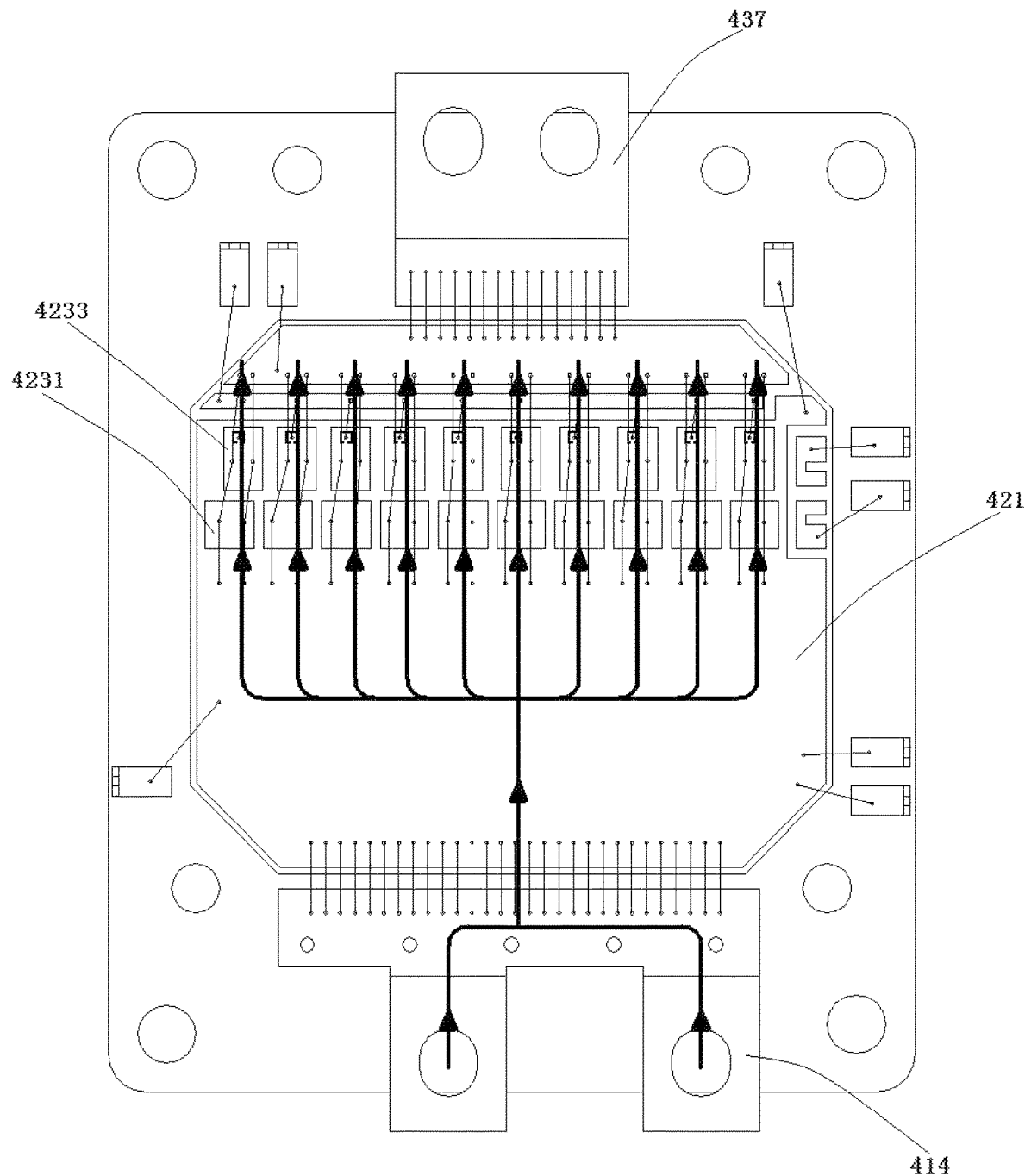
Figure 21C:
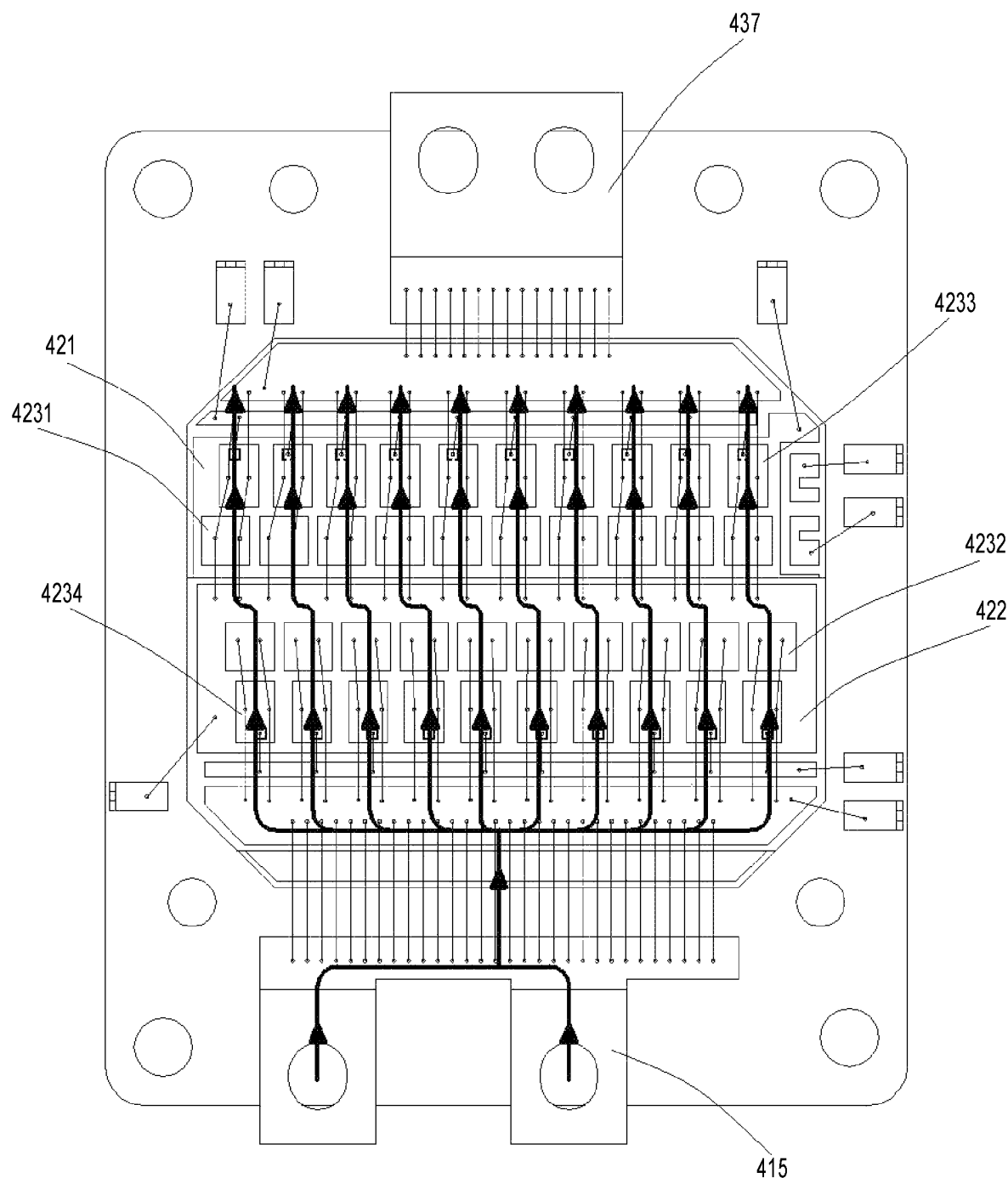

As shown in FIG. 21A, FIG. 21B and FIG. 21C, the power module is internally provided with the single-face heat-dissipation structure, including an upper half-bridge substrate 421 and a lower half-bridge substrate 422, wherein the upper half-bridge substrate 421 is provided with an upper half-bridge IGBT chip 4231 and an upper half-bridge diode chip 4233. The lower half-bridge substrate 422 is provided with a lower half-bridge IGBT chip 4232 and a lower half-bridge diode chip 4234. The first power module electrode is used as a positive electrode, the second power module electrode is used as a negative electrode, and in addition, the power module further includes an output electrode 437. The upper half-bridge substrate 421 has a three-layer structure, wherein a middle layer is an upper half-bridge substrate insulating layer, and upper and lower layers are upper half-bridge substrate metal layers. The lower half-bridge substrate 422 may have a two-layer structure, wherein an upper layer is a lower half-bridge substrate metal layer, and a lower layer is a lower half-bridge substrate insulating layer 424. The lower half-bridge substrate 422 may also have a three-layer structure, wherein a middle layer is a lower half-bridge substrate insulating layer 424, and upper and lower layers are lower half-bridge substrate metal layers. In order to better show current paths of upper and lower half bridges, the power module is split as FIG. 21B and FIG. 21C. FIG. 21B shows a working current path after enabling the upper half-bridge IGBT chip 4231. The working current flows from the connecting portion 414 of the first power module electrode into the upper half-bridge substrate 421 through a bonding wire, flows through the upper half-bridge IGBT chip 4231, and then flows out to the output electrode 437 through the bonding wire. FIG. 21C shows a freewheel current path after disabling the upper half-bridge IGBT chip 4231. The freewheel current flows from the connecting portion 415 of the second power module electrode into the lower half-bridge substrate 422 through a bonding wire, flows through the lower half-bridge diode chip 4234, and then flows out to the output electrode 437 through the bonding wire. In addition, the working current path after enabling the lower half-bridge IGBT chip 4232 is as follows: the working current flows from the connecting portion 415 of the second power module electrode into the lower half-bridge substrate 422 through a bonding wire, flows through the lower half-bridge IGBT chip 4232, and then flows out to the output electrode 437 through the bonding wire; and the freewheel current path after disabling the lower half-bridge IGBT chip 4232 is as follows: the freewheel current flows from the connecting portion 414 of the first power module electrode into the upper half-bridge substrate 421 through a bonding wire, flows through the upper half-bridge diode chip 4233, and then flows out to the output electrode 437 through the bonding wire.

2. Adoption of Double-Face Heat-Dissipation Structure

Figure 22:
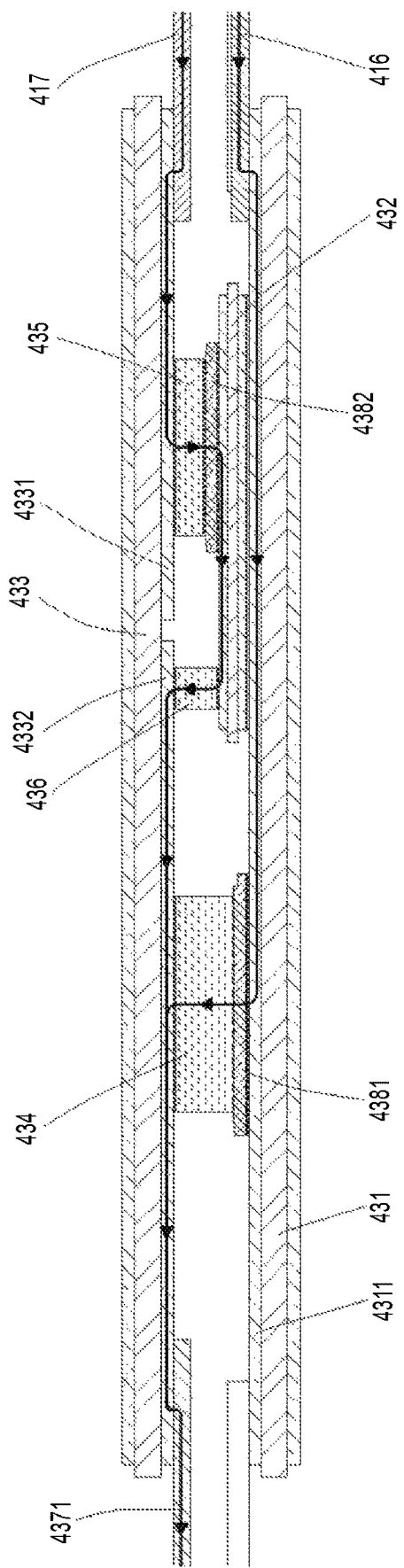
FIG. 22 is a schematic diagram of a double-face heat-dissipation structure used in the power module according to Embodiment 4 of the present invention.

As shown in FIG. 22, the power module is internally provided with the double-face heat-dissipation structure, including a bottom substrate 431, a middle substrate 432 and a top substrate 433. A copper layer on an upper surface of the bottom substrate 431 is a positive electrode copper layer 4311, and a lower surface of the top substrate 433 is provided with two copper layers separated from each other, namely a negative electrode copper layer 4331 and an output electrode copper layer 4332. The positive electrode copper layer 4311 is provided with an upper half-bridge chip 4381. A first connecting block 434 is arranged between the upper half-bridge chip 4381 and the output electrode copper layer 4332. The positive electrode copper layer 4311 is also provided with the middle substrate 432. The middle substrate 432 is also provided with a lower half-bridge chip 4382. A second connecting block 435 is arranged between the lower half-bridge chip 4382 and the negative electrode copper layer 4331, and a connecting column 436 is also arranged between the middle substrate 432 and the output electrode copper layer 4332. The first power module electrode is used as a positive electrode, the second power module electrode is used as a negative electrode, and in addition, the power module is also provided with the output electrode 437. The connecting portion 416 of the first power module electrode is connected with the positive electrode copper layer 4311. The connecting portion 417 of the second power module electrode is connected with the negative electrode copper layer 4331, and a connecting portion 4371 of the output electrode is connected with the output electrode copper layer 4332. FIG. 22 also shows a current path diagram during working and freewheeling. During working, a working current flows from the connecting portion 416 of the first power module electrode into the upper half-bridge chip 4381 through the positive electrode copper layer 4311, then flows to the output electrode copper layer 4332 through the first connecting block 434, and finally flows out from the connecting portion 4371 of the output electrode. During freewheeling, a freewheel current flows from the connecting portion 417 of the second power module electrode into the second connecting block 435 through the negative electrode copper layer 4331, then flows to the lower half-bridge chip 4382, then flows to the middle substrate 432, then flows into the output electrode copper layer 4332 through the connecting column 436, and finally flows out from the connecting portion 4371 of the output electrode.

A power module in the prior art is as shown in FIG. 8. The connecting portions of two power module electrodes are arranged side by side without overlapping. In the embodiment, simulation comparison is performed between the power module adopting the double-face heat-dissipation structure and the power module in the prior art, and simulation results are shown in Table 4.

TABLE 4

Simulation Comparison between Power Module Adopting Double-face Heat-dissipation Structure in Embodiment 4 and Power Module in the Prior Art.

|  | Prior art | Embodiment 4 - power module of double-face heat dissipation |
|---|---|---|
| Stray inductance (nH) | 12.99 | 3.62 nH |

TABLE 4-continued

Simulation Comparison between Power Module Adopting
Double-face Heat-dissipation Structure in Embodiment
4 and Power Module in the Prior Art.

| | Prior art | Embodiment 4 - power module of double-face heat dissipation |
|---|---|---|

It may be seen from Table 4 that stray inductance of the power module in the prior art is 12.99 nH, while stray inductance of the power module of double-face heat dissipation is only 3.62 nH, that is, the Embodiment 4 greatly reduces the stray inductance, which is also a good effect brought about by adopting the parallelly installed electrodes. The stray inductance is a crucial parameter for the power module, and a magnitude of the stray inductance directly affects a performance of the power module. Generally speaking, it is very difficult to reduce the stray inductance by several nH, and it is an extremely difficult breakthrough to reduce the stray inductance by nearly 10 nH in the embodiment, which is of great significance to development of a power module industry!

What is claimed is:

1. A power module using a parallel electrode combination, the parallel electrode combination comprising a first power module electrode and a second power module electrode, wherein a soldering portion of the first power module electrode and a soldering portion of the second power module electrode are respectively used to connect a power copper layer inside the power module, and a connecting portion of the first power module electrode and a connecting portion of the second power module electrode are opposite in parallel, the power module comprising an upper half-bridge substrate and a lower half-bridge substrate, wherein the upper half-bridge substrate is provided with an upper half-bridge IGBT chip and an upper half-bridge diode chip, the lower half-bridge substrate is provided with a lower half-bridge IGBT chip and a lower half-bridge diode chip, the first power module electrode and the second power module electrode are respectively used as positive and negative electrodes, and in addition, the power module further comprises an output electrode; a working current path after enabling the upper half-bridge IGBT chip is as follows: the working current flows from the connecting portion of the first power module electrode into the upper half-bridge substrate through a bonding wire, flows through the upper half-bridge IGBT chip, and then flows out to the output electrode through the bonding wire; a freewheel current path after disabling the upper half-bridge IGBT chip is as follows: the freewheel current flows from the connecting portion of the second power module electrode into the lower half-bridge substrate through a bonding wire, flows through the lower half-bridge diode chip, and then flows out to the output electrode through the bonding wire; the working current path after enabling the lower half-bridge IGBT chip is as follows: the working current flows from the connecting portion of the second power module electrode into the lower half-bridge substrate through a bonding wire, flows through the lower half-bridge IGBT chip, and then flows out to the output electrode through the bonding wire; and the freewheel current path after disabling the lower half-bridge IGBT chip is as follows: the freewheel current flows from the connecting portion of the first power module electrode into the upper half-bridge substrate through a bonding wire, flows through the upper half-bridge diode chip, and then flows out to the output electrode through the bonding wire.

2. A power module using a parallel electrode combination, the parallel electrode combination comprising a first power module electrode and a second power module electrode, wherein a soldering portion of the first power module electrode and a soldering portion of the second power module electrode are respectively used to connect a power copper layer inside the power module, and a connecting portion of the first power module electrode and a connecting portion of the second power module electrode are opposite in parallel, the power module comprising a bottom substrate and a top substrate, wherein the bottom substrate is provided with an upper half-bridge chip and a middle substrate, the middle substrate is provided with a lower half-bridge chip, the first power module electrode and the second power module electrode are respectively used as positive and negative electrodes, and in addition, the power module further comprises an output electrode; during working, a working current flows from the connecting portion of the first power module electrode into the bottom substrate, flows through the upper half-bridge chip to the top substrate, and then flows out through a connecting portion of the output electrode; and during freewheeling, a freewheel current flows from the connecting portion of the second power module electrode to the lower half-bridge chip through the top substrate, then flows into the middle substrate, then flows to the top substrate, and flows out through a connecting portion of the output electrode.

3. The power module according to claim 2, wherein an upper surface of the bottom substrate is provided with a positive copper layer, a lower surface of the top substrate is provided with a negative copper layer and an output copper layer separated from each other, a first connecting block is arranged between the upper half-bridge chip and the output copper layer, a second connecting block is arranged between the lower half-bridge chip and the negative copper layer, and a connecting column is also arranged between the middle substrate and the output copper layer; during working, a working current flows from the connecting portion of the first power module electrode into the upper half-bridge chip through the positive copper layer, then flows to the output copper layer through the first connecting block, and finally flows out from the connecting portion of the output electrode; and during freewheeling, a freewheel current flows from the connecting portion of the second power module electrode into the second connecting block through the negative copper layer, then flows to the lower half-bridge chip, then flows to the middle substrate, then flows into the output copper layer through the connecting column, and finally flows out from the connecting portion of the output electrode.

4. A power module group using a parallel electrode combination, the parallel electrode combination comprising a first power module electrode and a second power module electrode, wherein a soldering portion of the first power module electrode and a soldering portion of the second power module electrode are respectively used to connect a power copper layer inside the power module, and a connecting portion of the first power module electrode and a connecting portion of the second power module electrode are opposite in parallel, the power module group comprising a capacitor with a capacitor electrode combination and a power module with a power module electrode combination, wherein the capacitor electrode combination comprises a first capacitor electrode and a second capacitor electrode opposite in parallel, the first capacitor electrode and the second capacitor electrode are respectively connected with positive and negative electrodes of a capacitor core group, the power module electrode combination is the parallel electrode combination, and the connecting portion of the first power module electrode and the connecting portion of the second power module electrode can be inserted into a gap between the first capacitor electrode and the second capacitor electrode.

5. The power module group according to claim 4, wherein the first capacitor electrode is partially bulged, the second capacitor electrode is also partially bulge, a bulge of the first capacitor electrode and a bulge of the second capacitor electrode jointly form an accommodating cavity, and a connecting portion of the power module electrode combination can be inserted into the accommodating cavity.

6. The power module group according to claim 4, wherein the first capacitor electrode and the second capacitor electrode are both located in a middle of a side surface of the capacitor.

7. The power module group according to claim 4, wherein the first capacitor electrode and the second capacitor electrode are both plate-shaped.

8. A power module group using a parallel electrode combination, the parallel electrode combination comprising a first power module electrode and a second power module electrode, wherein a soldering portion of the first power module electrode and a soldering portion of the second power module electrode are respectively used to connect a power copper layer inside the power module, a connecting portion of the first power module electrode and a connecting portion of the second power module electrode are opposite in parallel, and the connecting portion of the first power module electrode and the connecting portion of the second power module electrode are both respectively provided with a connecting hole, the power module group comprising a capacitor with a capacitor electrode combination and a power module with a power module electrode combination, wherein the capacitor electrode combination comprises a first capacitor electrode and a second capacitor electrode, a soldering portion of the first capacitor electrode and a soldering portion of the second capacitor electrode are respectively connected with positive and negative electrodes of a capacitor core group, the soldering portion of the first capacitor electrode leads out a connecting portion of the first capacitor electrode, the soldering portion of the second capacitor electrode leads out a connecting portion of the second capacitor electrode, the connecting portion of the first capacitor electrode and the connecting portion of the second capacitor electrode are opposite in parallel, the connecting portion of the first capacitor electrode and the connecting portion of the second capacitor electrode are both respectively provided with a connecting hole, the power module electrode combination is the parallel electrode combination, and a connecting portion of the power module electrode combination is matched with a connecting portion of the capacitor electrode combination.

9. The power module group according to claim 8, wherein the soldering portion of the first capacitor electrode and the soldering portion of the second capacitor electrode are opposite in parallel.

10. The power module group according to claim 8, wherein the soldering portion of the first capacitor electrode and the soldering portion of the second capacitor electrode are both plate-shaped.

11. The power module group according to claim 8, wherein the soldering portion of the first capacitor electrode and the soldering portion of the second capacitor electrode are located in a middle of a side surface of the capacitor.

* * * * *